United States Patent
Yamamoto et al.

(10) Patent No.: US 6,806,794 B2
(45) Date of Patent: Oct. 19, 2004

(54) NOISE FILTER

(75) Inventors: Hidetoshi Yamamoto, Yokohama (JP);
Katsuyuki Uchida, Hikone (JP);
Kousuke Ishida, Sagamihara (JP);
Haruhiko Ueno, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/465,898

(22) Filed: Jun. 20, 2003

(65) Prior Publication Data

US 2004/0017280 A1 Jan. 29, 2004

Related U.S. Application Data

(63) Continuation-in-part of application No. 10/362,296, filed on Jul. 14, 2003.

(30) Foreign Application Priority Data

Jun. 20, 2002 (JP) ........................................ 2002-180356

(51) Int. Cl.[7] .................................................. H03H 7/01
(52) U.S. Cl. ...................................... 333/185; 333/184
(58) Field of Search .......................... 333/12, 184, 185, 333/204, 238

(56) References Cited

U.S. PATENT DOCUMENTS

| 5,051,712 A | * | 9/1991 | Naito et al. | ................. | 333/185 |
| 5,592,134 A | * | 1/1997 | Ogata et al. | ................. | 333/185 |
| 5,847,628 A | * | 12/1998 | Uchikoba et al. | ........... | 333/204 |
| 6,121,852 A | * | 9/2000 | Mizoguchi et al. | ........... | 333/35 |
| 6,133,809 A | * | 10/2000 | Tomohiro et al. | ........... | 333/185 |

FOREIGN PATENT DOCUMENTS

| JP | 59-137622 | 9/1984 | ............ H03H/7/01 |
| JP | 4-78119 | 3/1992 | ............ H01G/4/42 |
| JP | 5-299961 | 11/1993 | .......... H03H/7/075 |
| JP | 6-275436 | 9/1994 | .......... H01F/15/00 |
| JP | 7-45477 | 2/1995 | ............ H01G/4/40 |
| JP | 7-263280 | 10/1995 | ............ H01G/4/40 |
| JP | 9-214273 | 8/1997 | ............ H03H/7/01 |
| JP | 10-154632 | 6/1998 | ............ H01G/4/12 |
| JP | 10-322156 | 12/1998 | ............ H03H/7/01 |
| JP | 2000-348944 | 12/2000 | ............ H01F/17/08 |
| JP | 2000-357632 | 12/2000 | ............ H01G/4/40 |
| JP | 2001-160510 | 6/2001 | ............ H01F/17/00 |

* cited by examiner

Primary Examiner—Robert Pascal
Assistant Examiner—Dean Takaoka
(74) Attorney, Agent, or Firm—Keating & Bennett, LLP

(57) ABSTRACT

A noise filter includes a plurality of magnetic sheets stacked one on another. The magnetic sheets are baked to form a layered product. A transmission line is arranged between the second and third magnetic sheets. The transmission line extends linearly in the longitudinal direction of the layered product. Two ground conductors have the second and third magnetic sheets therebetween. Signal electrodes connected to both ends of the transmission line are arranged adjacent to both ends, in the longitudinal direction, of the layered product. Grounding electrodes connected to the ground conductors are arranged in the middle positions, in the longitudinal direction, of the layered product. With the ground conductors being grounded, a signal passes through the transmission line, thus attenuating high-frequency noise using heat dissipation by the four magnetic sheets.

9 Claims, 28 Drawing Sheets

NOISE FILTER

This application is a Continuation-in-Part of U.S. patent application Ser. No. 10/362,296, filed on Jul. 14, 2003, currently pending.

BACKGROUND OF THE INVENTION

1. Field of the Invention

The present invention relates to a noise filter which is suitable for use in suppression of electromagnetic noise interferences in electronic devices.

2. Description of the Related Art

In general, various types of noise filters are used for suppression of electromagnetic noise interferences in electronic devices. In a known related art noise filter, for example, a circuit using a lumped constant such as a three-terminal capacitor is formed (see for example, Japanese Unexamined Patent Application Publication No. 10-154632). In such a noise filter of the related art, noise is suppressed using a reflection loss in which the reflection coefficient is increased at the frequency of noise to be generated.

Moreover, in a known noise filter according to another related art device, a circuit including many inductors and capacitors is formed (see for example, Japanese Unexamined Patent Application Publication No. 2000-34894).

According to the above-mentioned related art techniques, noise is suppressed by use of the reflection loss. In the case where a noise filter is disposed, e.g., in a line connecting circuits to each other, problems are caused in that probably, noise having a specific frequency resonates between the noise filter and a circuit in the periphery thereof, and the resonance causes amplification of the noise.

Especially, in recent years, signal frequencies to be adapted for digital devices tend to become higher, and the number of electronic devices of which the signal frequencies exceed 100 MHz has been increased. Therefore, low-pass filters of which the cut-off frequencies exceed 200 MHz have been demanded. On the other hand, for example, the lengths of lines between a noise filter and components disposed at the periphery thereof and the lengths of lines between plural components are such that resonance with a signal (noise) with a high frequency of 200 MHz or higher may occur easily. Accordingly, for electronic components of which the signal frequencies exceed 100 MHz, noise filters using reflection loss as carried out in the related art devices are difficult to be used.

Moreover, according to the other related art device, resonance phenomena are suppressed by reduction of the reflection loss. However, in the noise filter of the other related art, many inductors and capacitors are connected to form a circuit. The structure is complicated, the size can be reduced with much difficulty, and the manufacturing cost is high. Moreover, problematically, the noise filter is difficult to be fixed to a printed wiring, since the filter does not have a chip-shape configuration.

SUMMARY OF THE INVENTION

In order to overcome the problems described above, preferred embodiments of the present invention provide a noise filter that prevents noise from resonating and has a very small size and is inexpensive.

According to a preferred embodiment of the present invention, a noise filter includes a plurality of magnetic sheets stacked on one another; transmission lines, and ground conductors. The ground conductors are arranged on the top and bottom layers of the magnetic sheets. The transmission lines and the ground conductors are alternately stacked between the magnetic sheets. One end of each of the transmission lines is connected to a different corresponding signal input electrode, and the other end of each of the transmission lines is connected to a different one of the corresponding signal output electrodes, and the transmission lines of the multiple layers have different characteristic impedances.

Since the transmission lines of the multiple layers are connected to the different corresponding signal input electrodes and signal output electrodes, the transmission lines of the multiple layers individually function as low-pass filters, and the entirety of the transmission lines serves as a noise filter array. Noise is suppressed by utilizing an increase in heat dissipation by the magnetic sheets when RF signals pass through the transmission lines of the layers. The characteristic impedance of the noise filter is set by setting the width dimensions of the transmission lines and the thickness dimensions of the magnetic sheets to appropriate values. In particular, the relative magnetic permeability of a magnetic material is a constant irrespective of the signal frequency, the impedance is matched in substantially the entire frequency domain with a circuit connected to the noise filter, and return loss of the noise filter is reduced.

The transmission lines of the multiple layers individually function as independent low-pass filters. When, for example, the transmission lines of the multiple layers are connected using through lines penetrating through the magnetic sheets, impedance mismatching easily occurs near the through lines, which are discontinuous points. Compared with such a case, according to preferred embodiments of the present invention, impedance mismatching does not occur in the transmission lines. Therefore, noise reflection does not occur in the transmission lines, noise resonance is suppressed, and impedance matching with an external circuit is easily achieved.

While the ground conductors are arranged on the top and bottom layers of the plural magnetic sheets which are stacked on one another, the transmission lines and the ground conductors are alternately disposed between the magnetic sheets. Accordingly, the transmission line of each layer is held between the two magnetic sheets, and the entire transmission line of each layer is covered by the two ground conductors. Thus, a signal passing through the transmission line of each layer is confined between the ground conductors, and a pass-band signal is prevented from attenuating.

Since the ground conductors are arranged on the top and bottom layers of the plural magnetic sheets superposed on one another, external noise is prevented from entering the transmission lines of the layers. Thus, signals are reliably transmitted.

The transmission lines of the multiple layers have different characteristic impedances. Accordingly, the transmission lines of the layers are connected to wiring having a plurality of types of characteristic impedances while the impedances of the transmission lines are matched with those of the wiring. By connecting the transmission lines in parallel with one another, constituting some or all of the multiple layers, the number of types of characteristic impedances is increased. As a result, the number of types of wiring to which the noise filter is applicable is increased.

The transmission lines may be meandering and/or zigzag. Alternatively, the transmission lines may be spiral.

Accordingly, compared with a case in which the transmission lines are linear, the length dimensions of the transmission lines are increased, and noise attenuation is increased.

According to another preferred embodiment of the present invention, a noise filter includes magnetic sheets, a transmission line arranged on the front surface of one of the magnetic sheets, and a ground conductor arranged on the back surface of the one magnetic sheet. The ground conductor covers, from the back, the entirety of the transmission line.

With this arrangement, noise in a signal passing through the transmission line is suppressed by utilizing heat dissipation by the magnetic sheets. The characteristic impedance of the noise filter is set by setting the width dimension of the transmission line and the thickness dimensions of the magnetic sheets to appropriate values. The characteristic impedance is maintained substantially at a constant irrespective of the signal frequency. The impedance is matched in substantially the entire frequency domain with a circuit connected to the noise filter. Therefore, return loss of the noise filter is reduced. Since the entire transmission line is covered, from the back, by the ground conductor, the characteristic impedance of the entire transmission line is set to a constant. Therefore, noise reflection and noise resonance are suppressed.

The transmission line may be spiral. Accordingly, magnetic fluxes generated by the transmission line are added together. Thus, the inductance and the characteristic impedance of the transmission line are increased.

The transmission line may be meandering and/or zigzag. Accordingly, compared with a case in which the transmission line is linear, the length dimension of the transmission line is increased, and noise attenuation is increased.

The magnetic sheets may be substantially rectangular. Signal electrodes connected to both ends of the transmission line may be arranged adjacent to both ends, in the longitudinal direction, of the one magnetic sheet. Grounding electrodes connected to the ground conductor may be arranged in the middle positions, in the longitudinal direction, of the one magnetic sheet.

Accordingly, the signal electrodes placed adjacent to both ends, in the longitudinal direction, of the magnetic sheet are easily connected in the middle of linear wiring. The grounding electrodes, which are placed in the middle positions in the longitudinal direction of the magnetic sheet, are easily connected to ground terminals arranged in the vicinity of the wiring. It thus becomes easier to assemble the noise filter.

The magnetic sheets may be made of sintered ferrite or other suitable material.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
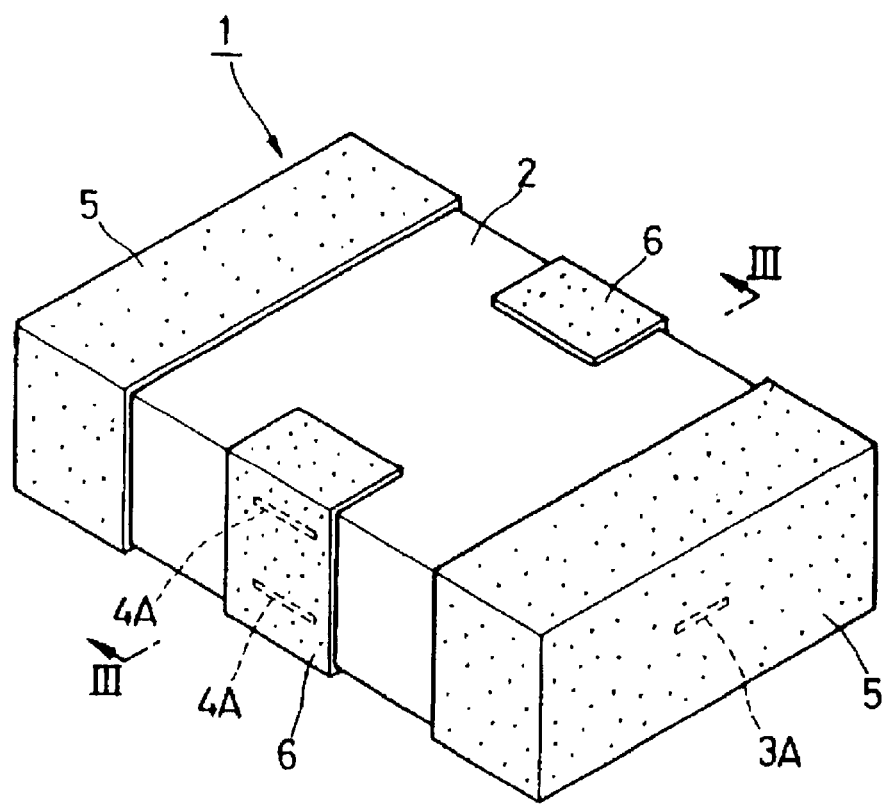
FIG. 1 is a perspective view of a noise filter according to a first preferred embodiment of the present invention.
Figure 2:
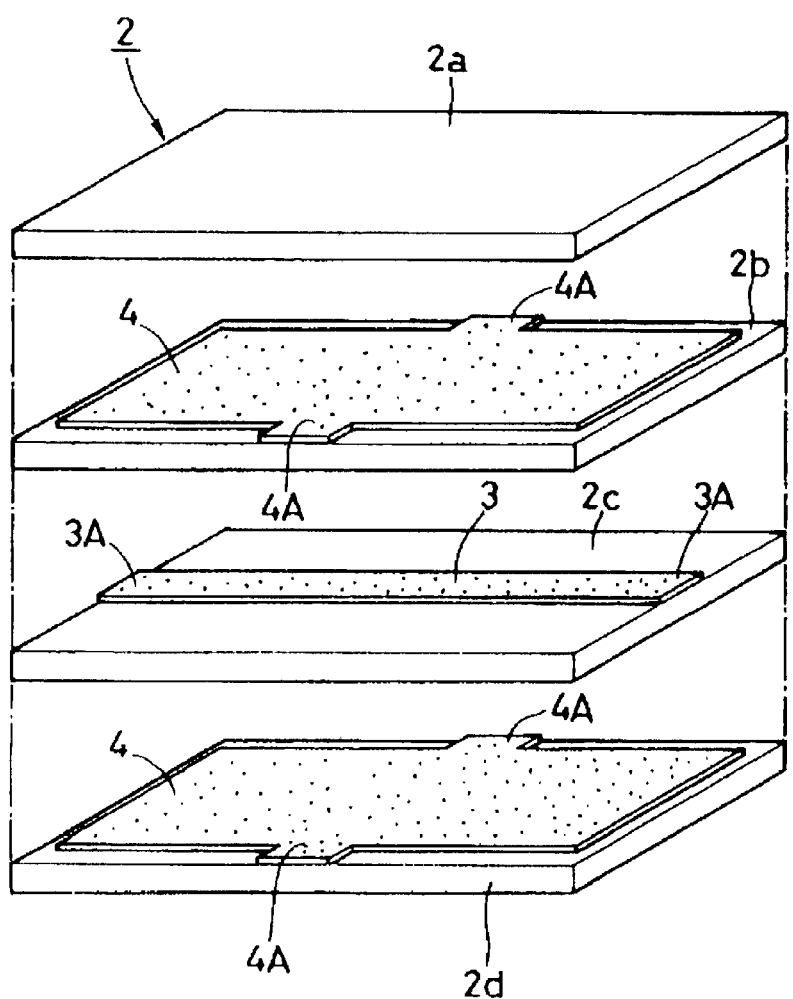
FIG. 2 is an exploded perspective view of the noise filter according to the first preferred embodiment of the present invention.
Figure 3:
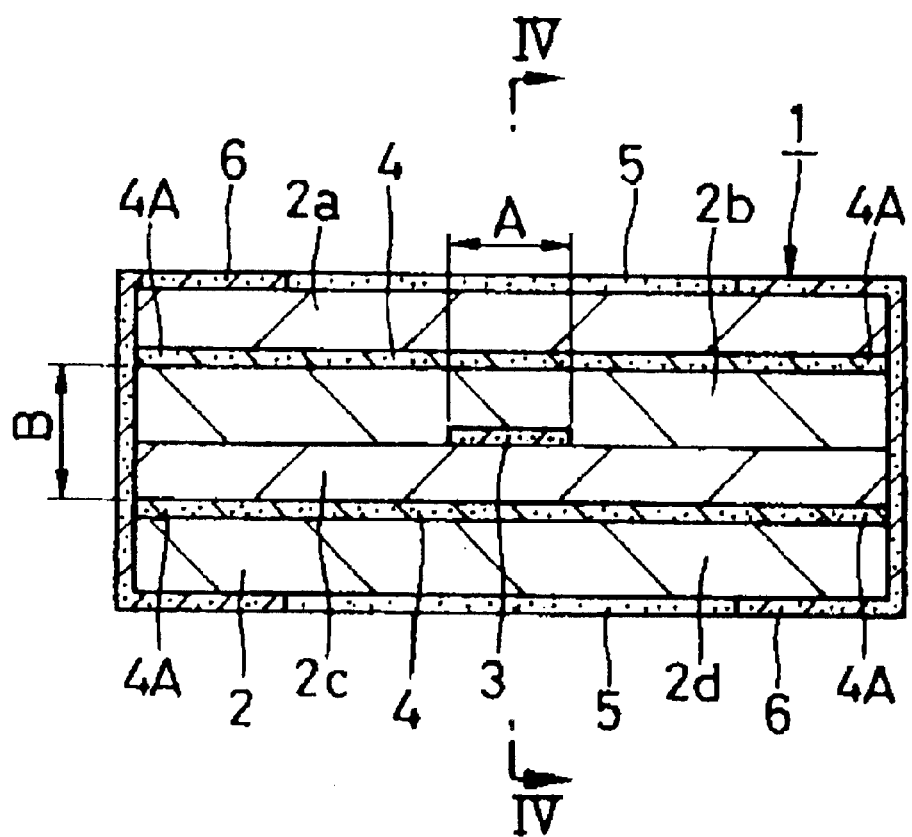
FIG. 3 is a cross-sectional view of the noise filter taken in the direction indicated by arrow III—III of FIG. 1.
Figure 4:
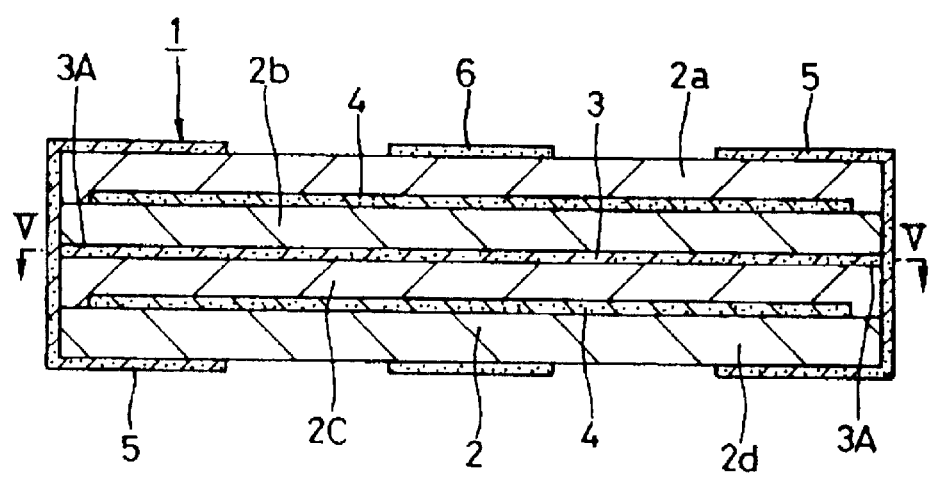
FIG. 4 is a cross-sectional view of the noise filter taken in the direction indicated by arrow IV—IV of FIG. 3.
Figure 5:
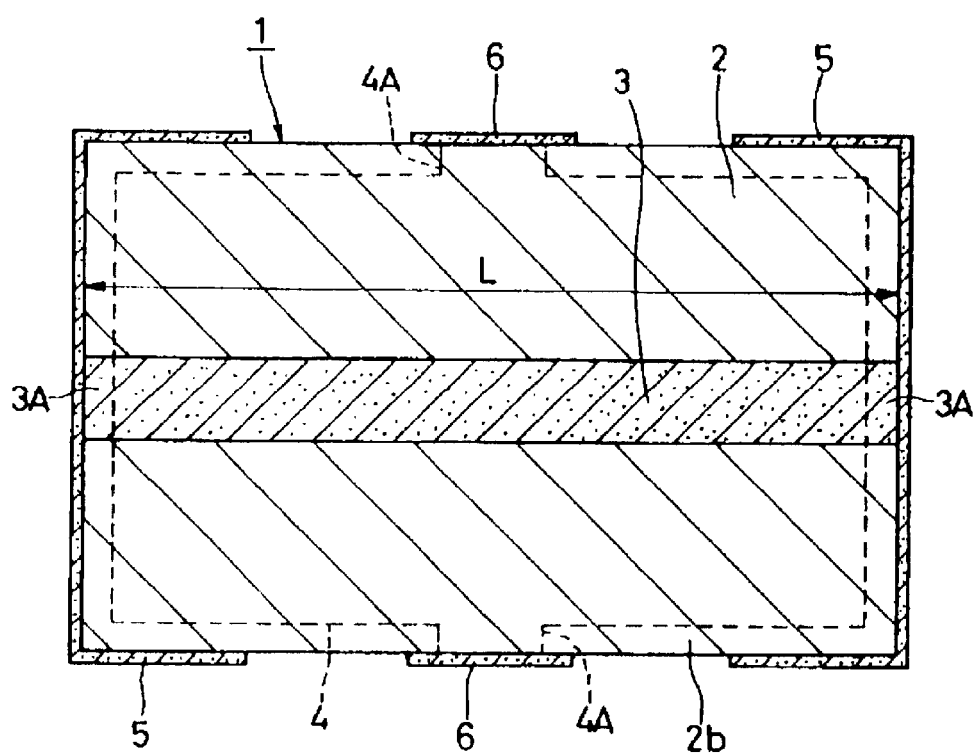
FIG. 5 is a cross-sectional view of the noise filter taken in the direction of arrow V—V of FIG. 4.

With reference to FIGS. 1 to 28, a noise filter according to preferred embodiments of the present invention will be described in detail.

FIGS. 1 to 5 deal with the first preferred embodiment of the present invention. Reference numeral 1 designates a noise filter according to this preferred embodiment. The noise filter 1 includes magnetic sheets 2a to 2d which will be described later, a transmission line 3, ground conductors 4, signal electrodes 5, and a ground electrode 6. Moreover, the cut-off frequency fc of the noise filter 1 is preferably set at a value e.g., within the range of about 200 MHz to about 2 GHz (about 200 MHz≦fc≦about 2 GHz).

A laminate 2 has a substantially rectangular column shape which constitutes the outline of the noise filter 1. The laminate 2 is formed preferably by pressing of, e.g., four magnetic sheets 2a to 2d laid on each other and then firing these magnetic sheets 2a to 2d. Moreover, the magnetic sheets 2a to 2d preferably have a substantially quadrangular sheet shape, respectively, and are made of a ceramic material having a magnetic characteristic such as ferrite or the other suitable material. The relative permeability of the magnetic sheets 2b and 2c sandwiched by the two ground conductors 4 which will be described below is preferably set at e.g., a value within the range of about 4 to about 30 (about 4≦μr≦about 30).

The material for the magnetic sheets 2a and 2d may be different from that for the magnetic sheets 2b and 2d. However, to reduce the manufacturing cost, it is preferable to use the same material for all four magnetic sheets 2a to 2d.

The transmission line 3 is disposed between the magnetic sheets 2b and 2c. The transmission line 3 preferably has a substantially belt-shaped configuration and is preferably made of an electroconductive metallic material such as silver paste, palladium, or other suitable material. The transmission line 3 is positioned in the center between the magnetic sheets 2b and 2c in the short-side direction thereof and is extended in a straight line shape in the longitudinal direction. Moreover, the transmission line 3 is positioned substantially in the center between the two ground conductors 3 which will be described below. Both the ends of the transmission line 3 constitute electrode portions 3A, which are connected to the signal electrodes 5, respectively.

The characteristic impedance W of the transmission line 3 has a value expressed by the following Formula 2, in which A is the width of the transmission line 3, B is the distance between the two ground conductors 4, $\mu$ is the magnetic permeability of the laminate 2 (magnetic sheets 2b and 2c), and $\epsilon$ is the dielectric constant of the laminate 2.

$$W = \frac{1}{4}\sqrt{\frac{\mu}{\varepsilon}}\frac{B}{A} \qquad \text{Formula 2}$$

Moreover, for example, the length L of the transmission line is preferably set at a value which, together with the relative permeability $\mu r$ of the magnetic sheets 2b and 2c, satisfies the following Formula 3.

$$\frac{L}{\sqrt{\mu_r - 1}} \geq 3 \text{ mm} \qquad \text{Formula 3}$$

In the case where the noise filter 1 is formed as a small chip component, the length L of the transmission line 3 is required to be up to 100 mm. On the other hand, the relative permeability $\mu r$ of the magnetic sheets 2b and 2c preferably satisfies the following relationship of about 4≦μr≦about 30. Therefore, the value of L/√(μr−1) is preferably in the range of from about 3 mm to about 20 mm as shown by the following Formula 4.

$$3 \text{ mm} \leq \frac{L}{\sqrt{\mu_r - 1}} \leq 20 \text{ mm} \qquad \text{Formula 4}$$

The ground conductors 4 are provided on the front surface of the magnetic sheet 2b and on the back surface of the magnetic sheet 2c, respectively. Thus, the ground conductors 4 sandwich the two magnetic sheets 2b and 2c, which are disposed in the middle position in the thickness direction of the noise filter 1, from the upper and lower surfaces thereof, respectively. Moreover, the ground conductors 4 preferably have a substantially quadrangular flat-sheet shape and are preferably made of an electroconductive metallic material such as silver paste, palladium or other suitable material, and cover substantially all the surfaces of the magnetic sheets 2b and 2c, respectively. Moreover, electrode portions 4A are provided in the middle portions of the ground conductors 4 in the longitudinal direction (the right-left side direction in FIG. 2) of the substantially quadrangular magnetic sheets 2b and 2c, respectively. The electrode portions 4A are extended in the width direction (the front-back surface direction in FIG. 2) toward both the side-edges so as to have a tongue shape, respectively. The electrode portions 4A are connected to the below-described ground electrodes 6, respectively. The ground conductors 4 are covered with the magnetic sheets 2a and 2d, respectively.

The signal electrodes 5 are provided on both the ends in the longitudinal direction of the laminate 2 (magnetic sheets 2a to 2d). The signal electrodes 5 cover the end surfaces of the laminate 2 and also cover the front surface, the back surface, and the side surfaces so as to form cylinders, respectively. Regarding the signal electrodes 5, for example, an electroconductive metallic material is coated onto both the ends of the laminate 2, and thereafter, the electroconductive metallic material is baked so that the signal electrodes 5 are fixed. The signal electrodes 5 are connected to the electrode portions 3A of the transmission line 3, respectively.

The ground electrodes 6 are provided on both the end surfaces in the width direction of the laminate 2 and in the middle portions in the longitudinal direction of the laminate 2, respectively. Each ground electrode 6 has a substantially U-shaped configuration and is extended on the side surfaces of the laminate 2 in the thickness direction, and a portion of each ground electrode 6 is extended onto the front and back surfaces of the laminate 2 so as to form a substantially U-shaped configuration. For example, the ground electrode 6 is preferably formed by coating an electroconductive metallic material onto the side surfaces of the laminate 2 and baking it. The ground electrodes 6 are connected to the electrode portions 4A of the ground conductors 4, respectively.

The noise filter 1 of this preferred embodiment is preferably formed as described above. The operation will be described below.

First, the noise filter 1 is disposed on a substrate having a wiring through which a signal is transmitted. The signal electrodes 5 are connected to the wiring on the way thereof, respectively, and the ground electrodes 6 are connected to ground terminals, respectively. Thereby, a signal can be transmitted through the transmission line 3, and the ground conductors 4 have the ground potential.

Referring to the magnetic material such as ferrite or the like constituting the magnetic sheets 2a to 2d, as the frequency of a signal which is transmitted through the transmission line 3 is increased, the heat loss of the signal tends to be increased. Therefore, a low-pass filter can be formed by utilization of the heat loss. Accordingly, a signal having a frequency (about 100 MHz to about 1 GHz) lower than the cut-off frequency fc which is preferably, e.g., about 200 MHz to about 2 GHz can be transmitted through the transmission line 3. A signal with a higher frequency than the above-mentioned frequency can be attenuated as noise to be suppressed.

Moreover, the characteristic impedance W of the noise filter 1 can be set by appropriately setting the width A of the transmission line 3 and the thickness of the magnetic sheets 2b and 2c (distance B between the ground conductors 4). Moreover, the dielectric constant μr of the magnetic material is substantially constant irrespective of the frequency of a signal. Thus, the characteristic impedance W can be kept at a substantially constant value irrespective of the frequency of the signal. Accordingly, regarding circuits connected to the noise filter 1, the impedance matching can be achieved substantially in the overall frequency range, the reflection loss of the noise filter 1 can be reduced, and the noise, which may be caused by the resonance, can be prevented from increasing.

Moreover, due to the configuration in which the transmission line 3 positioned between the magnetic sheets 2b and 2c can be covered with the two ground conductors 4 over the entire length of the line 3, the noise is prevented from reflecting along the transmission line 3, and the noise can be prevented from resonating. Moreover, the signal, which is being transmitted through the transmission line 3, can be confined between the ground conductors 4. Thus, the attenuation of the signal in the pass-band can be prevented, and incorporation of external noise into the transmission line 3 can be prevented. Thus, the signal can be securely transmitted.

The cut-off frequency fc of the noise filter 1 can be appropriately set by adjustment of the composition (i.e., the relative permeability μr of the magnetic sheets 2b and 2c) of the magnetic material for the magnetic sheets 2a to 2d and the length L of the transmission line 3.

The relationship of the cut-off frequency fc to the relative permeability μr of the magnetic sheets 2b and 2c and the length L of the transmission line 3 will be described with reference to FIGS. 6 to 11.

In an example, first, the relative permeability μr of the magnetic sheets 2b and 2c was preferably set at a constant value, e.g., at about 10 (μr=about 10), and the lengths L of the transmission lines 3 were preferably set at 5 mm, 10 mm, and 50 mm, respectively. Then, the noise filter 1 was simulated.

Figure 6:
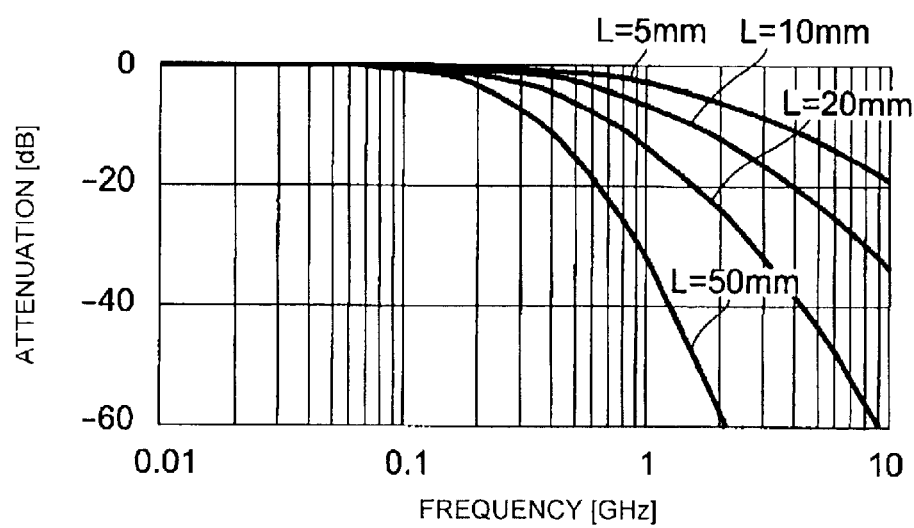
FIG. 6 is a characteristic diagram showing the correlation between the frequency of a signal and the attenuation obtained when the relative permeability $\mu r$ of a magnetic sheet is about 10.

As a result, as shown in FIG. 6, four attenuation curves were obtained corresponding to the lengths L of the four-type transmission lines 3.

As seen in the results of FIG. 6, the longer the length L of the transmission line 3 becomes, the more the cut-off frequency fc (the frequency at which the attenuation is about −3 dB) decreases, and also, for example, the slope (the ratio of the change of the attenuation to that of the frequency) of the attenuation curve increases at the attenuation of about −10 dB.

Moreover, the lengths L of the transmission lines 3 set at a constant value, e.g., at 50 mm (L=50 mm), and the relative permeabilities μr of the magnetic sheets 2b and 2c were set at 3, 5, 10, 20, and 30, respectively. Thus, the noise filter 1 was simulated. As a result, as seen in FIG. 7, five attenuation curves were obtained.

Figure 7:
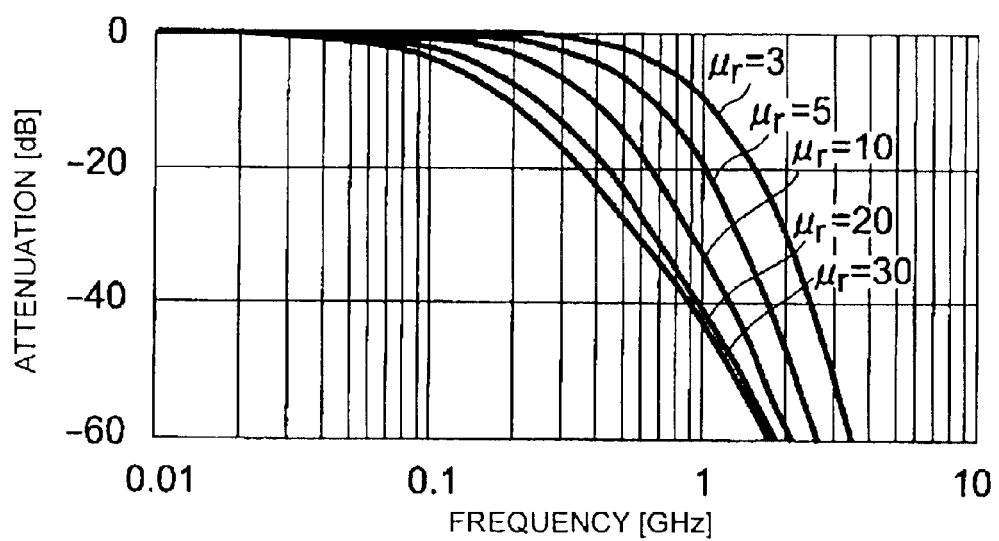
FIG. 7 is a characteristic diagram showing the correlation between the frequency of a signal and the attenuation obtained when the length L of a transmission line is about 50 mm.

As seen in the results of FIG. 7, the larger the relative permeability μr becomes, the lower the cut-off frequency fc becomes, and however, the slope of the attenuation curve is reduced, e.g., at an attenuation of −10 dB.

The inventors of the present invention have intensively investigated these characteristics. As a result, it has been discovered that when the constants C [mm] determined according to the following Formula 5 based on the lengths L of the transmission lines 3 and the relative permeabilities μr of the magnetic sheets 2b and 2c are equal, the shapes (slopes) of the attenuation curves are substantially the same, even if the lengths L and also the relative permeabilities μr are different from each other, respectively.

$$C = \frac{L}{\sqrt{\mu_r - 1}} \qquad \text{Formula 5}$$

Figure 8:
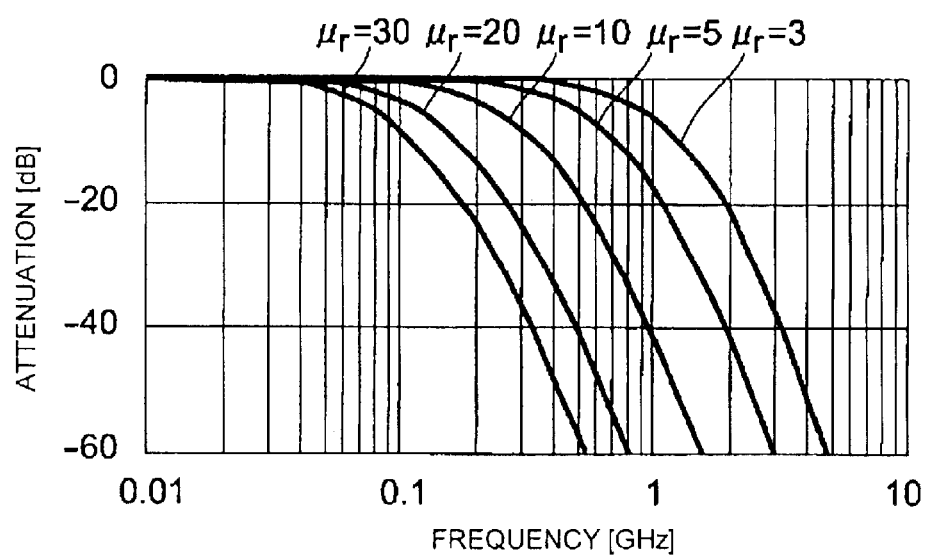
FIG. 8 is a characteristic diagram showing the correlation between the frequency of a signal and the attenuation obtained when the constant C is about 20 mm.

For example, the constant C was set at a constant value, e.g., of about 20 mm (C=20 mm), the relative permeabilities μr of the magnetic sheets 2b and 2c were set at approximately 3, 5, 10, 20, and 30, and the lengths L of the transmission line 3 were set at approximately 35 mm, 45 mm, 63 mm, 89 mm, and 109 mm, respectively, and the simulation was carried out. FIG. 8 shows the obtained attenuation curves.

Figure 9:
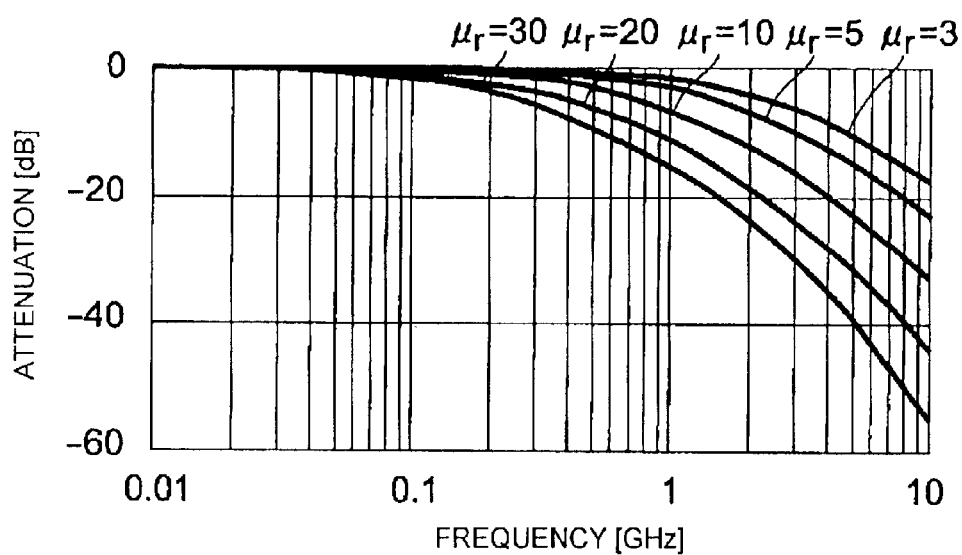
FIG. 9 is a characteristic diagram showing the correlation between the frequency of a signal and the attenuation obtained when the constant C is about 3 mm.

Moreover, the constant C was set at a constant value, e.g., of about 3 mm (C=3 mm), the relative permeabilities μr of the magnetic sheets 2b and 2c were set at approximately 3, 5, 10, 20, and 30, and the lengths L of the transmission line 3 were set at approximately 5.19 mm, 6.72 mm, 9.48 mm, 13.4 mm, and 16.4 mm, respectively, and the simulation was carried out. FIG. 9 shows the obtained attenuation curves.

Thus, when the constants C are equal, the cut-off frequency fc is reduced with increases in the relative permeability μr. However, even when the lengths L and also the relative permeabilities μr are different from each other, respectively, the shapes (slopes) of the attenuation curves are substantially the same. Furthermore, the slope of the attenuation becomes larger with increasing of the constant C.

Figure 10:
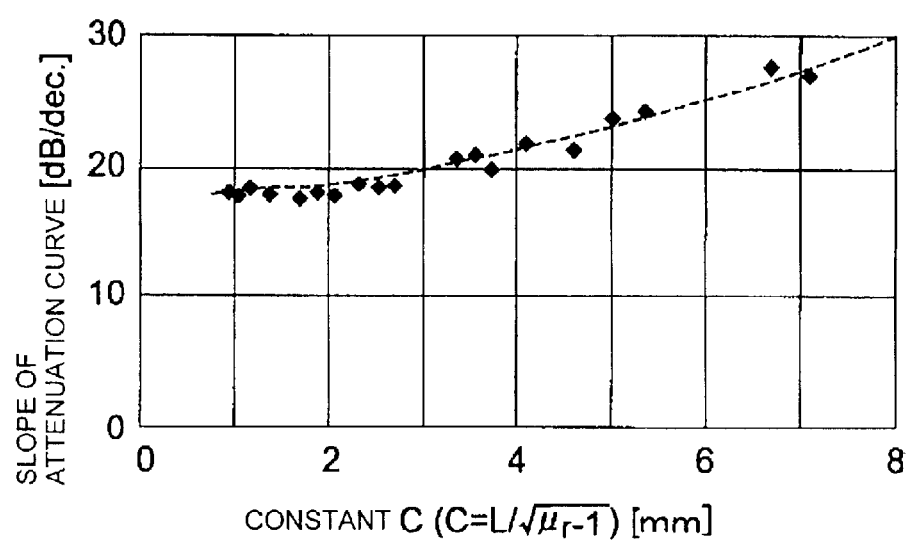
FIG. 10 is a characteristic diagram showing the correlation between the constant C and the inclination of an attenuation curve.

Moreover, investigation has been made regarding the relationship between the constants C and the slopes of the attenuation curves at an attenuation of about −10 dB. Thus, the results shown in FIG. 10 were obtained. The slope of the attenuation curve of a bypass capacitor, which is generally used for noise countermeasures, is about 20 dB/dec. Preferably, the bypass filter has a slope larger than about 20 dB/dec. for use as a noise-countermeasure element. As seen in the results of FIG. 10, when the constant C is larger than about 3 mm, the slope of the attenuation is at least approximately 20 dB/dec. Thus, the filter is significantly effective as an element for counteracting noise.

Figure 11:
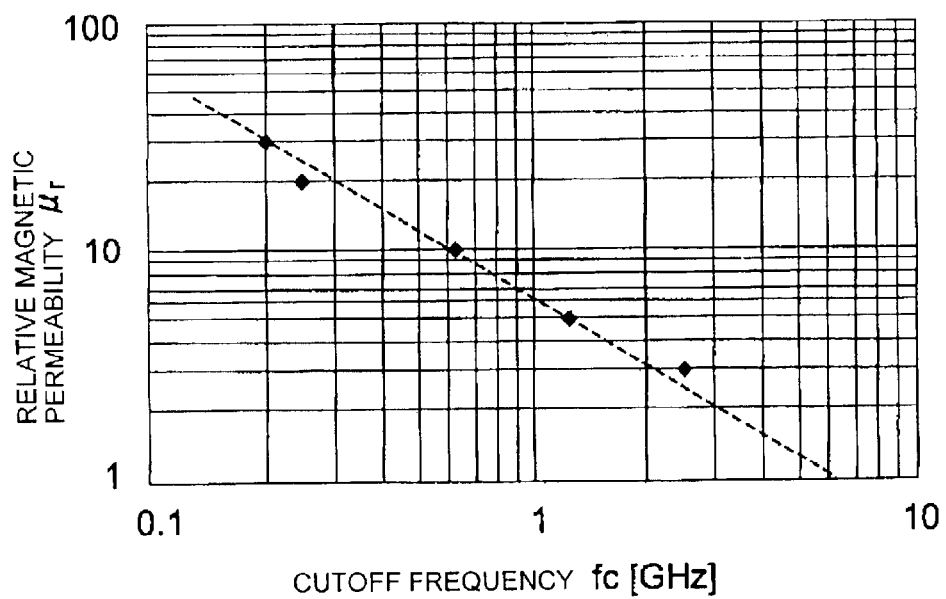
FIG. 11 is a characteristic diagram showing the correlation between the cut-off frequency fc and the relative permeability $\mu r$ of a magnetic sheet.
Figure 12:
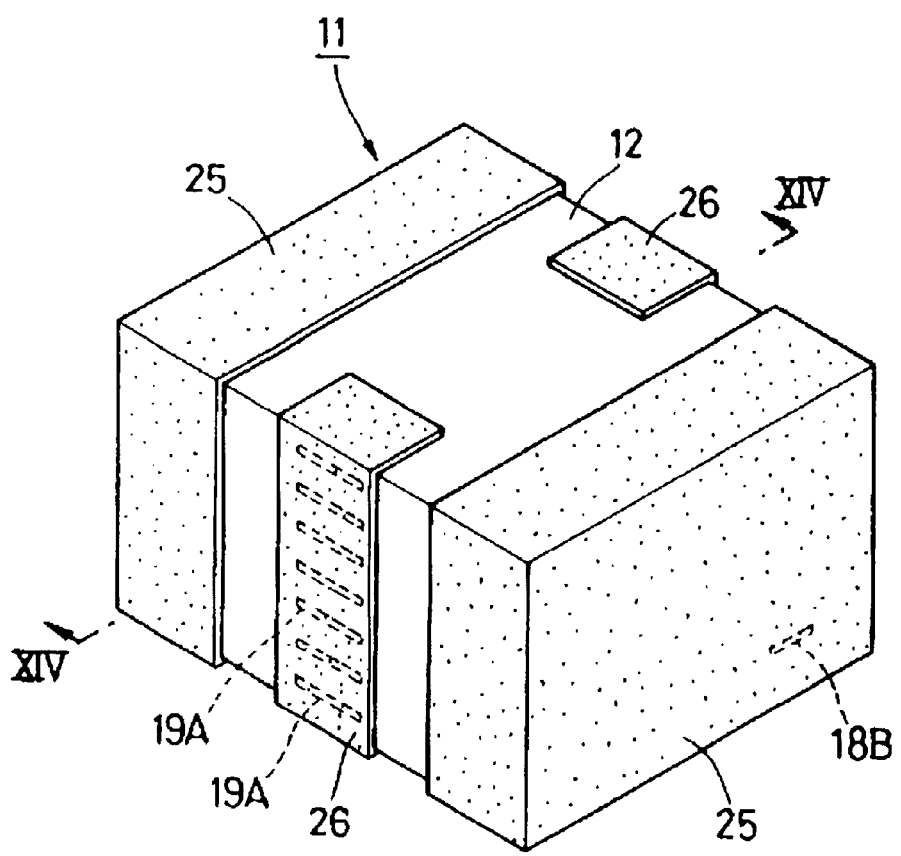
FIG. 12 is a perspective view of a noise filter according to a second preferred embodiment of the present invention.
Figure 13:
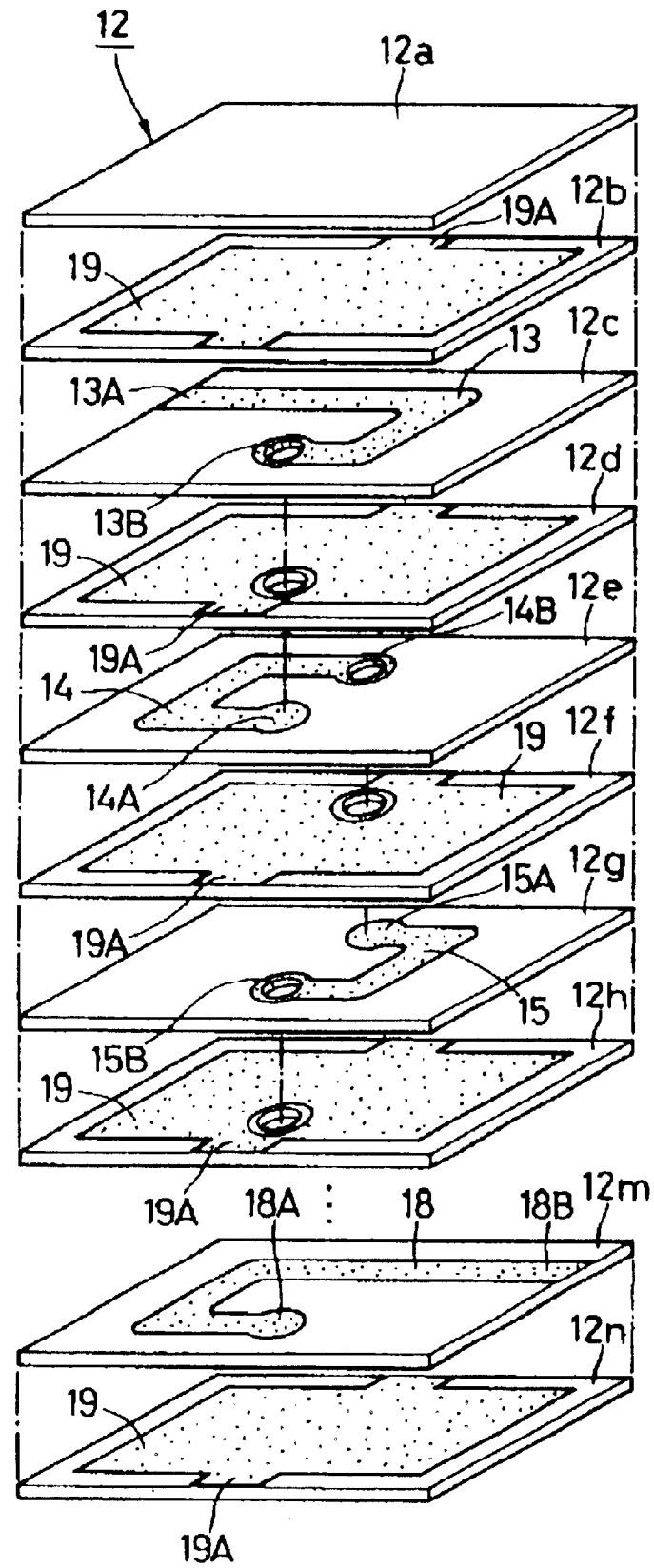
FIG. 13 is an exploded perspective view of the exploded noise filter according to the second preferred embodiment of the present invention.
Figure 14:
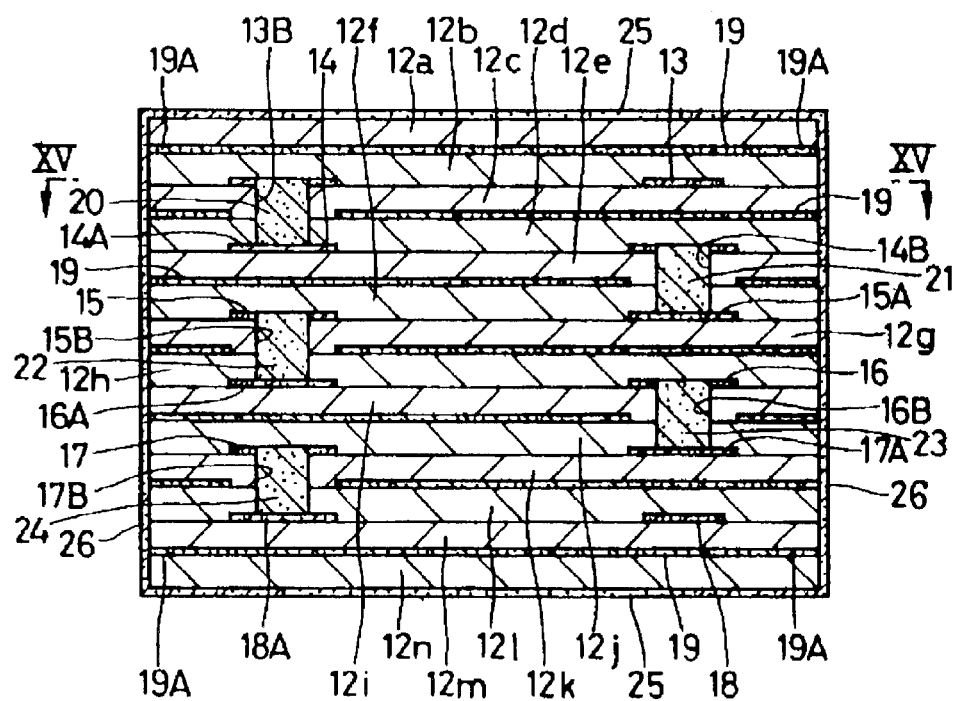
FIG. 14 is a cross-sectional view of the noise filter taken along the direction arrow XIV—XIV of FIG. 12.
Figure 15:
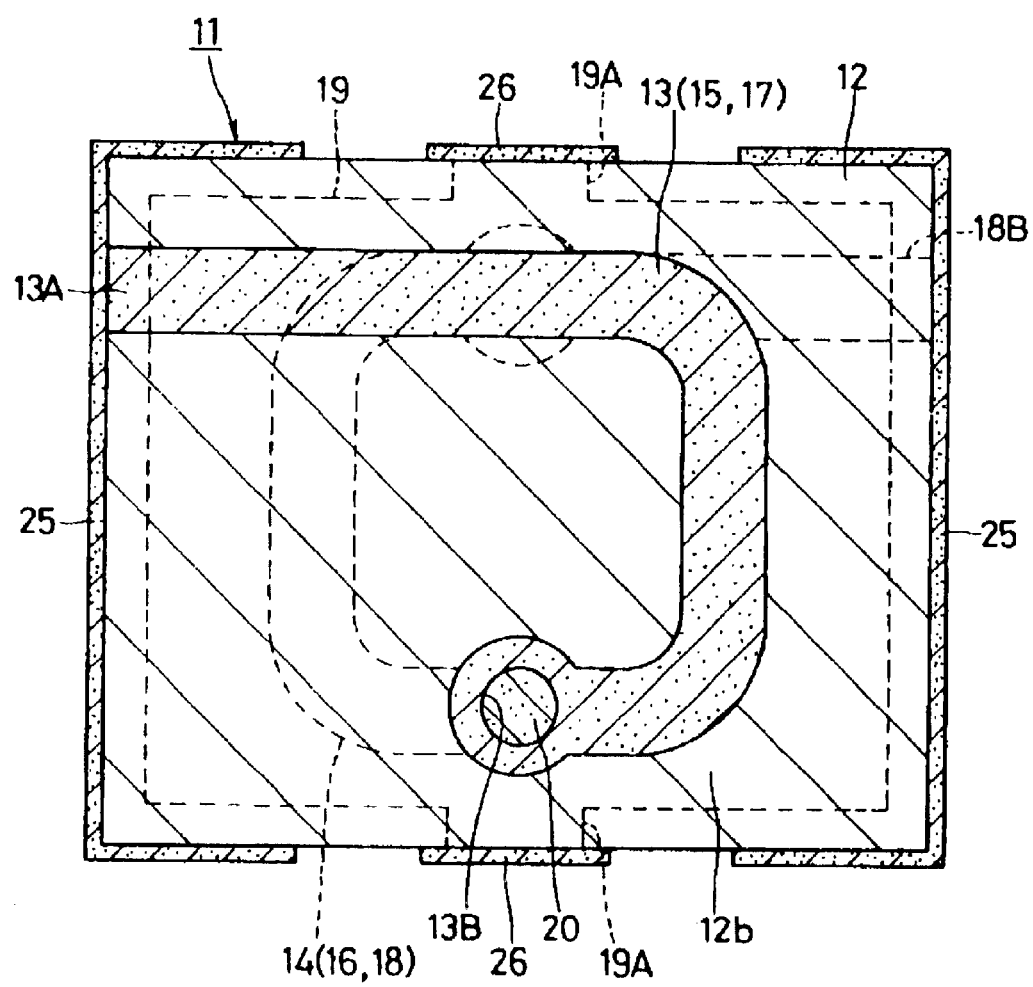
FIG. 15 is a cross-sectional view of the noise filter taken along the direction arrow XV—XV of FIG. 14.
Figure 16:
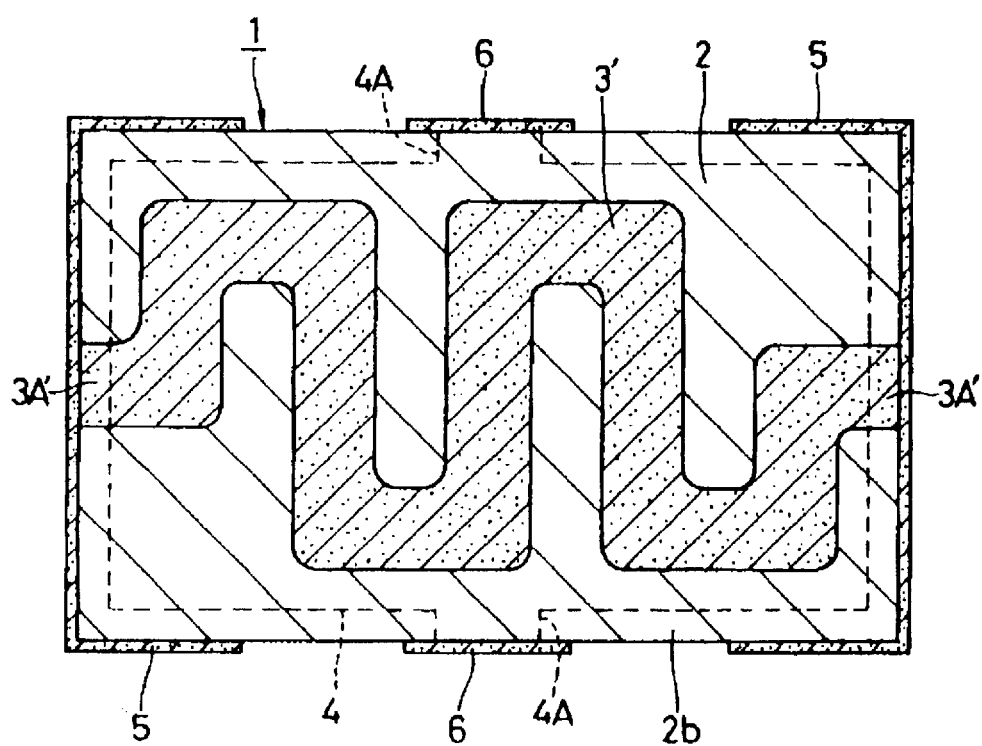
FIG. 16 is a cross-sectional view of a noise filter according to a first modification example taken at the position similar to that in the case of FIG. 5.

It is seen in the results of FIGS. 8 and 9 that in the case of the equal relative permeabilities μr, the cut-off frequency fc (the frequency at which the attenuation is about −3 dB) is enhanced with decreases in the constant C. Thus, to reveal the highest cut-off frequency fc of the noise filter 1, the constant C was set at about 3 mm(C=about 3 mm), and the relationship between the relative permeability μr and the cut-off frequency fc was investigated. FIG. 11 shows the results.

In recent years, wireless LAN has been spread as a way to transmit information between digital equipments. High frequency signals with frequencies of about 2.45 GHz and about 5 GHz are used for the wireless LAN. Thus, to protect low frequency signals (about several hundred MHz) in digital equipment from the above-described high frequency signals, it is required to provide a noise filter having a cut-off frequency of up to approximately 2 GHz. As a result of the investigation regarding the results of FIG. 11, it is seen that the relative permeability μr may be set at about 4 for setting of the cut-off frequency fc at approximately 2 GHz.

The constant C is inversely proportional to $\sqrt{(\mu r-1)}$ as seen in Formula 5. When the L of the transmission line 3 is constant, the constant C can be increased and the slope of the attenuation curve can be also increased by setting of the relative permeability μr at a small value. Moreover, when the constant C is kept at a constant value, the length L of the transmission line 3 can be decreased, and the size of the noise filter 1 can be reduced by setting of the relative permeability μr to a small value.

Accordingly, preferably, the relative permeability μr is set at the smallest possible value, e.g., at about 4. However, according to the results of FIG. 11, when the constant C is set at the minimum value, that is, about 3 mm (C=about 3 mm), the cut-off frequency fc can be set at about 200 MHz which is required for digital equipment and so forth, even if the relative permeability μr is set at about 30. Therefore, it is preferred to set the relative permeability at a value within the range of from about 4 to about 30 (about 4≦μr≦about 30).

Moreover, the constant C is increased with increases in the length L of the transmission line 3. Accordingly, preferably, the size L is set at the largest possible value. However, the overall size of the noise filter 1 is increased with increases in the length L. Therefore, to produce the noise filter 1 having a practically suitable size, the length L is preferably up to approximately 100 mm. Since the minimum value of the relative permeability μr is about 4, the maximum value of the constant C is about 20. Accordingly, it is preferable to set the constant C at a value within the range of from about 3 mm to about 20 mm (about 3 mm≦C≦about 20 mm).

As described above, according to this preferred embodiment, the transmission line is disposed between the two magnetic sheets 2b and 2c, and moreover, these magnetic sheets 2b and 2c are covered with the two ground conductors 4. Accordingly, noise can be prevented by use of the heat loss of the magnetic material constituting the magnetic sheets 2b and 2c. Moreover, the characteristic impedance W of the transmission line 3 can be kept substantially at a constant value, irrespective of the frequency of a signal. Thus, the impedance matching with an external circuit can be easily achieved. Therefore, the reflection loss of the noise filter 1 can be reduced, and the noise, which may be caused by resonance, can be prevented from increasing.

The transmission line, which is positioned between the magnetic sheets 2b and 2c, can be covered with the two ground conductors 4 over the whole length thereof. Therefore, the characteristic impedance of the transmission line 3 can be kept at a constant value over the whole length thereof. No noise reflects along the transmission line 3, and moreover, a signal while it is being transmitted through the transmission line 3 can be confined between the ground conductors 4. Therefore, the attenuation of a signal in the pass-band can be prevented, and moreover, incorporation of external noise into the transmission line 3 can be prevented. Thus, a signal can be securely transmitted.

Furthermore, the magnetic sheets 2a and 2d preferably have a substantially quadrangular shape. The signal electrodes 5 are provided on both end surfaces in the longitudinal direction of the magnetic sheets 2a to 2d so as to be connected to both the ends of the transmission line 3. The ground electrodes 5 connected to the ground conductors 4 are provided in the middle positions in the longitudinal direction of the magnetic sheets 2a to 2d. Accordingly, the signal electrodes 5 positioned on both the end surfaces in the longitudinal direction of the magnetic sheets 2a to 2d can be easily connected to a linearly-extended wiring along a length thereof. Moreover, the ground electrodes 6, provided in the middle positions in the longitudinal direction of the magnetic sheets 2a to 2d, can be easily connected to ground terminals which are provided on the periphery of the wiring. Thus, the integration-property of the noise filter 1 is greatly improved.

Furthermore, the relative permeability μr of the magnetic sheets 2b and 2c is preferably within the range of about 4≦μr≦about 30, and moreover, the length L of the transmission line is set so that the constant C is at least about 3 mm (C≧about 3 mm). Accordingly, the cut-off frequency fc can be easily set to be within the range of about 200 MHz≦fc≦about 2 GHz which is suitable for practical application. The slope of the attenuation curve of noise tends to increase in proportion to the length L of the transmission line 3 and also increase in reverse proportion to $\sqrt{(\mu r-1)}$. Therefore, the slope of an attenuation curve for noise can be set e.g., at about 20 dB/dec. or higher by setting of the relative permeability μr of the magnetic sheets 2b and 2c to be within the range of about 4≦μr≦about 30 and also by setting the constant C at about 3 mm or larger. As a result, the difference between the attenuations of a signal and noise can be increased. Thus, the signal can be passed without being attenuated, and the noise can be securely attenuated.

FIGS. 12 to 15 show a noise filter according to a second preferred embodiment of the present invention. Characteristically, the noise filter of this preferred embodiment has a configuration in which transmission lines and ground conductors are alternately laminated in such a manner that the uppermost and lowermost layers of the magnetic sheets include ground conductors, respectively.

A noise filter 11 includes magnetic sheets 12a to 12n, transmission lines 13 to 18, ground conductors 19, pass through lines 20 to 24, signal electrodes 25, and ground electrodes 26.

The laminate 12 preferably has a substantially prism-shape which constitutes the outline of the noise filter 11. The laminate 12 is formed by overlaying, e.g., fourteen magnetic sheets 12a to 12n, pressing them in the laminated state, and firing these magnetic sheets 12a to 12n. Each of the magnetic sheets 12a to 12n preferably has a substantially quadrangular sheet shape, and for example, is formed of a ceramic material having a magnetic property such as ferrite or other suitable material.

The transmission lines 13 to 18 are disposed between a set of the magnetic sheets 12b and 12c, between a set of the magnetic sheets 12d and 12e, between a set of the magnetic sheets 12f and 12g, between a set of the magnetic sheets 12h and 12i, between a set of the magnetic sheets 12j and 12k, and between a set of the magnetic sheets 12*l* and 12*m*, respectively. Each of the transmission lines 13 to 18 is formed of an electroconductive metallic material in a substantially U-shaped configuration or a substantially circular configuration including a turning-portion. These transmission lines 13 to 18 are connected in series with each other so as to define a frame-shaped coil having a substantially quadrangular or substantially circular opening in the thickness direction of the laminate 12.

Referring to the transmission line 13 between the magnetic sheets 12*b* and 12*c* positioned on the upper layer surface, one end of the line 13 constitutes an electrode portion 13A which is extended on the one-end side in the longitudinal direction of the laminate 12 and is connected to a signal electrode 25. A through-hole 13B passing through the magnetic sheets 12*c* and 12*d* is provided on the other end side of the transmission line 13.

Referring to the transmission line 14 between the magnetic sheets 12*d* and 12*e*, a connecting portion 14A which is connected to the transmission line 13 through the through-hole 13B is provided on one-end side of the line 14. A through-hole 14B passing through the magnetic sheets 12*e* and 12*f* is provided on the other end side of the line 14.

Similarly, for the transmission line 15 between the magnetic sheets 12*f* and 12*g*, a connecting portion 15A is provided on one end side of the line 14, and a through-hole 15B is also provided on the other end side. Moreover, for the transmission line 16 between the magnetic sheets 12*h* and 12*i*, a connecting portion 16A is provided on one end side of the line 16, and a through-hole 16B is also provided on the other end side. Furthermore, for the transmission line 17 between the magnetic sheets 12*j* and 12*k*, a connecting portion 17A is provided on one end side of the line 17, and a through-hole 17B is also provided on the other end side.

Also, for the transmission line 18 between the magnetic sheets 12*l* and 12*m* positioned on the lower layer surface, a connecting portion 18A which is connected to the transmission line 17 through the through-hole 17B is provided on one end side thereof. The other end side of the line 4 constitutes an electrode portion 18B which is extended to the other end side in the longitudinal direction of the laminate 12 and is connected to a signal electrode 25 which will be described below.

The characteristic impedances of the transmission lines 13 to 18 are determined by the widths of the transmission lines 13 to 18, the distances between adjacent ground conductors 19, and the relative permeability and the dielectric constant of the laminate 12, similarly to the transmission line 3 of the first preferred embodiment. Therefore, the characteristic impedance over the entire length of the transmission lines 13 to 18 can be set at a constant value by setting of the widths of the transmission lines 13 to 18 substantially at the same value and also by setting the thicknesses of the magnetic sheets 12*b* to 12*m* substantially at the same value.

The ground conductors 19 are disposed between the magnetic sheets 12*a* to 12*n* so as to sandwich the transmission lines 13 to 18 of the respective layers. The ground conductors 19 are disposed as the uppermost and lowermost layers of the magnetic sheets 12*b* to 12*m*, respectively, and are overlaid alternately with the transmission lines 13 to 18 between the magnetic sheets 12*b* to 12*m*. Moreover, the ground conductors 19 are formed of an electroconductive metallic material to have a substantially quadrangular flat sheet shape, respectively, and cover substantially the entire surfaces of the magnetic sheets 12*b* to 12*m*. Moreover, electrode portions 19A are disposed in the ground conductors 19 so as to protrude toward both the end-sides in the width direction, respectively, as in the case of the ground conductors 4 of the first preferred embodiment. The electrode portions 19A are connected to ground electrodes 26 which will be described below.

The pass through lines 20 to 24 are conductors which connects the transmission lines 13 to 18 in series with each other. The pass through lines 20 to 24 are preferably formed by filling an electroconductive metallic material such as silver paste, palladium, or other suitable material into the through-holes 13B to 17B, respectively.

The signal electrodes 25 are provided on both the end-sides in the longitudinal direction of the laminate 12 (magnetic sheets 12*a* to 12*n*). The signal electrodes 25 cover the end surfaces of the laminate 12, and also cover the front surface and back surface and the side surfaces thereof so as to have a substantially cylindrical shape, respectively, similarly to the signal electrodes 5 of the first preferred embodiment. The signal electrodes 25 are preferably formed by coating an electroconductive metallic material and firing it, and are connected to the electrode portions 13A and 18B of the transmission lines 13 and 18.

The ground conductors 26 are disposed at the middle positions in the longitudinal direction of the laminate 12, on both the end sides in the width direction of the laminate 12. Each of the ground conductors 26 preferably has a substantially U-shaped configuration. The ground conductor 26 is extended in a belt-shaped pattern on the side surface of the laminate 12 in the thickness direction thereof, and a portion of the ground conductor 26 is extended on the front and back surfaces of the laminate 12. The ground conductors 26 are formed, e.g., by coating an electroconductive metallic material onto the side surfaces of the laminate 12 and firing it, and are connected to the electrode portions 19A of the ground conductors 19, respectively.

Thus, according to this preferred embodiment constituted as described above, the same advantages as those of the first preferred embodiment can be obtained. Especially, since the six-layer transmission lines 13 to 18 are connected in series with each other by the pass through lines 20 to 24 arranged so as to pass through the respective magnetic sheets 12*c* to 12*l*, the overall length of the transmission lines 13 to 18 can be increased. Thus, the heat loss with respect to noise transmitting through the transmission lines 13 to 18 can be increased, and the attenuation can be greatly improved.

Moreover, the characteristic impedances of the transmission lines 13 to 18 contained in the respective layers of the laminate can be made substantially equal to each other by setting of the widths of the transmission lines 13 to 18 at substantially the same value, and also by setting the thicknesses of the magnetic sheets 12*b* to 12*m* substantially at the same value. Accordingly, the characteristic impedance can be prevented from changing along the transmission lines 13 to 18. The impedance matching with an external circuit can be easily provided.

Moreover, the transmission lines 13 to 18 preferably have a substantially U-shaped configuration or substantially circular configurations so that a coil is defined by all of the transmission lines 13 to 18. Accordingly, although the thickness of the noise filter 11 becomes large to some degree, the bottom area of the noise filter 11 can be set to be nearly equal to the opening area of the transmission lines 13 to 18 which define a coil. Therefore, the noise filter 11 can be arranged even in a narrow mounting space. Thus, the mounting-flexibility of the noise filter 11 can be greatly improved.

According to the first preferred embodiment, the transmission line is extended in a linear line pattern. A transmission line 3' having a zigzag pattern, which meanders, repeatedly turning around in the width direction of the laminate 2, may be arranged as seen in the first modification example of FIG. 16. Further, a transmission line (not shown) having a zigzag pattern, which meanders, repeatedly turning around in the longitudinal direction of the laminate 2, may be used.

In the case where the transmission line 3' has a zigzag pattern as described above, the length can be increased compared to the case where the transmission line 3 has a linear line pattern as in the first preferred embodiment. Thus, the attenuation of noise can be greatly improved.

Moreover, according to the second preferred embodiment, the transmission lines 13 to 18 preferably have a substantially U-shaped configuration or a substantially circular configuration, respectively. The transmission lines may be arranged in a zigzag pattern or a spiral pattern similarly to the first modification example.

Figure 17:
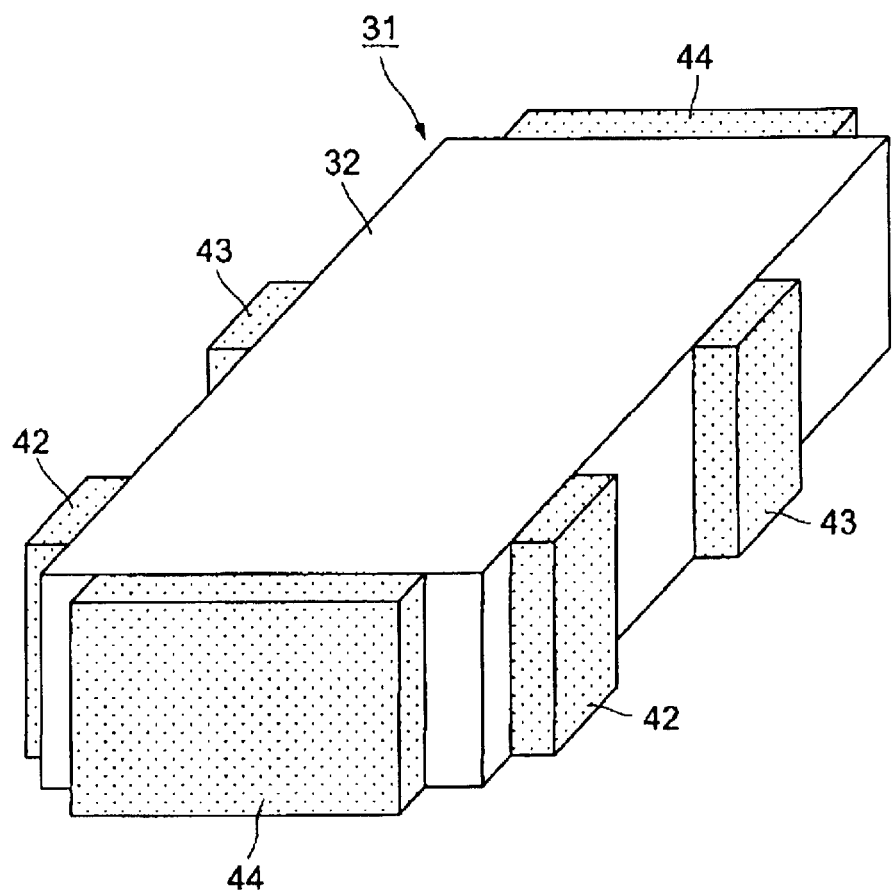
FIG. 17 is a perspective view of a noise filter according to a third preferred embodiment of the present invention.
Figure 18:
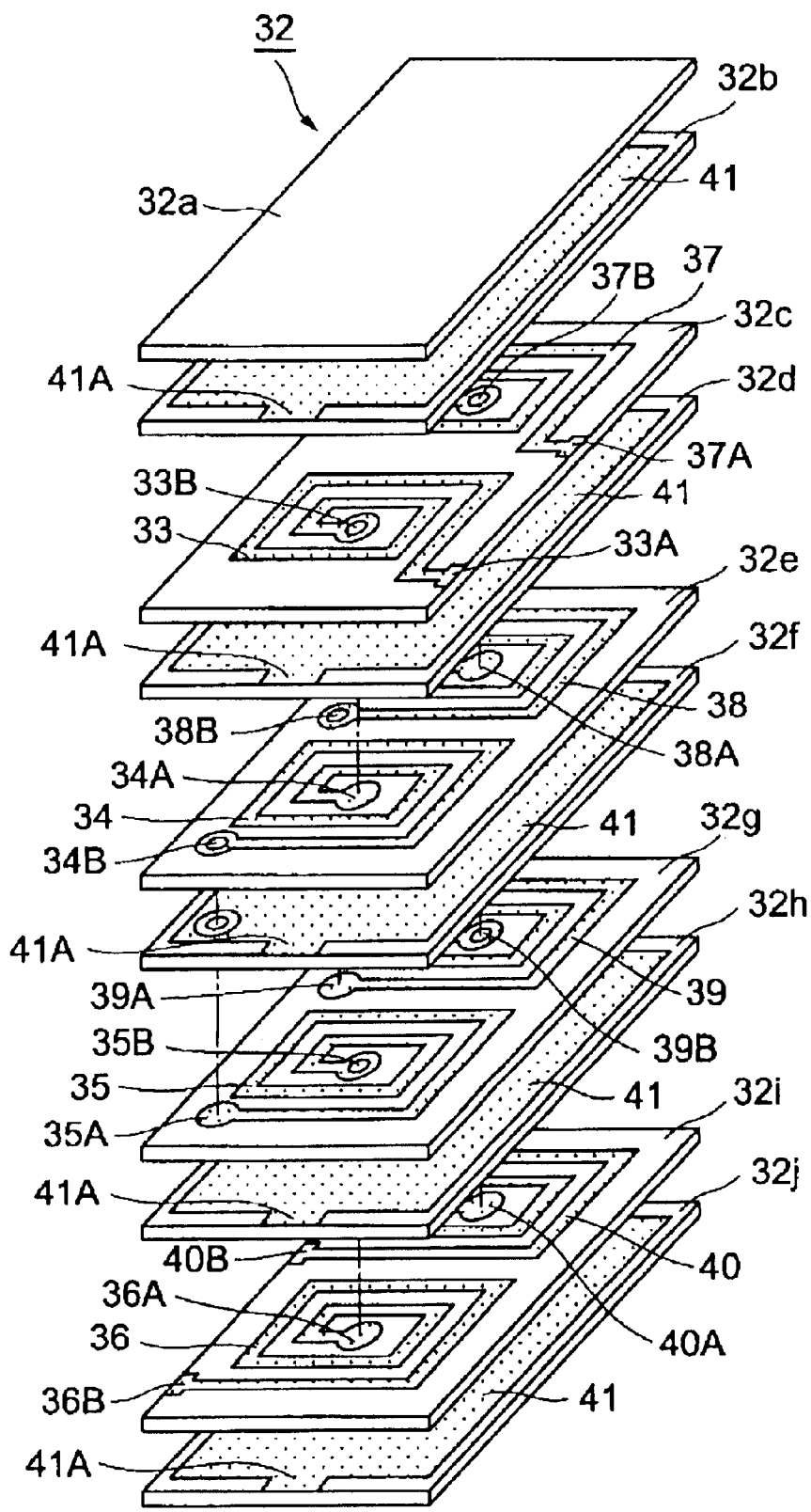
FIG. 18 is an exploded perspective view of the noise filter of the third preferred embodiment of the present invention.

FIGS. 17 and 18 show a noise filter according to a third preferred embodiment of the present invention. Characteristically, in the noise filter of this preferred embodiment, first and second transmission lines are preferably provided on the same layer between magnetic sheets. First transmission lines and second transmission lines, and magnetic sheets are alternately overlaid, so that the plural first transmission lines are connected in series with each other, and moreover, the plural second transmission lines are connected in series with each other, independently of the first transmission lines.

A noise filter 31 preferably includes magnetic sheets 32a to 32j, first transmission lines 33 to 36, second transmission lines 37 to 40, ground conductors 41, pass through lines (not shown), first signal electrodes 42, second signal electrodes 43, and ground conductors 44, which will be described below.

The laminate 32 preferably has a substantially prism shape, which defines the outline of the noise filter 31. The laminate 32 is formed by laminating, e.g., ten magnetic sheets 32a to 32j. Each of the magnetic sheets 32a to 32j is preferably formed of a ceramic material such as ferrite or other suitable material having a magnetic property, into a substantially quadrangular shape.

The first transmission lines 33 to 36 are disposed between a set of the magnetic sheets 32b and 32c, between a set of the magnetic sheets 32d and 32e, between a set of the magnetic sheets 32f and 32g, and between a set of the magnetic sheets 32h and 32i, respectively. That is, total four layers are preferably provided. The transmission lines 33 to 36 each are preferably formed of an electroconductive metallic material in a substantially spiral pattern, and are arranged in opposition to each other in the thickness direction of the laminate 32, respectively.

In this case, one-end side of the transmission line 33 forms an electrode portion 33A which is extended toward one-end side in the longitudinal direction (the right and left side direction in FIG. 18) of the laminate 32. The other-end side of the transmission line 33 is positioned in the center of the spiral pattern, and is provided with a through-hole 33B passing through the magnetic sheets 32c and 32d.

One-end side of the transmission line 34 is positioned in the center of the spiral pattern and is provided with a connecting portion 34A to be connected to the transmission line 33 through the through-hole 33B. The other-end side of the transmission line 34 is positioned on the outer peripheral side of the spiral pattern and is provided with a through-hole 34B passing through the magnetic sheets 32e and 32f. Similarly, one-end side of the transmission line 35 is positioned on the outer peripheral side of the spiral pattern and is provided with a connecting portion 35A. The other-end side of the transmission line 35 is positioned in the center of the spiral pattern and is provided with a through-hole 35B.

Moreover, one-end side of the transmission line 36 is positioned in the center of the spiral pattern, and is provided with a connecting portion 36A to be connected to the transmission line 35 through the through-hole 35B. The other-end side of the transmission line 36 is positioned on the outer peripheral side of the spiral pattern, and constitutes an electrode portion 36B which is extended toward the other end side in the longitudinal direction of the laminate 32. A pass-through line (not shown) is preferably formed of an electroconductive metallic material in the through-holes 33B, 34B, and 35B as in the case of the second preferred embodiment. Thereby, the transmission lines 33 to 36 are connected in series with each other via the pass-through line.

Moreover, the widths of the transmission lines 33 to 36 are preferably set substantially at the same value, and also, the thicknesses of the magnetic sheets 32b to 32i are preferably set substantially at the same value. Thus, the characteristic impedance of the transmission lines 33 to 36 is substantially constant over the entire length thereof.

The second transmission lines 37 to 40 are disposed between a set of the magnetic sheets 32b and 32c, between a set of the magnetic sheets 32d and 32e, between a set of the magnetic sheets 32f and 32g, and between a set of the magnetic sheets 32h and 32i, respectively. That is, total four layers are preferably provided. The second transmission lines 37 to 40 are arranged in positions different from those of the first transmission lines 33 to 36, that is, the second transmission lines are arranged so as to be shifted from the first transmission lines 33 to 36 in the width direction (the front-rear surface direction in FIG. 18), and are electrically insulated from the first transmission lines 33 to 36. Moreover, the transmission lines 37 to 40 each are preferably formed of an electroconductive metallic material in a substantially spiral pattern, and are arranged in opposition to each other in the thickness direction of the laminate 32.

The second transmission lines 37 to 40 have substantially the same pattern as the first transmission lines 33 to 36, respectively. An electrode portion 37A is provided on one-end side of the transmission line 37. A through-hole 37B is provided on the other-end side of the transmission line 37. Similarly, connecting portions 38A and 39A are provided on one-end sides of the transmission line 38 and 39, respectively. Through-holes 38B and 39B are provided on the other-end sides of the transmission lines 38 and 39, respectively. Moreover, a connecting portion 40A is provided on one-side of the transmission line 40, and an electrode portion 40B is provided on the other-end side of the transmission line 40.

Moreover, pass-through lines (not shown) are preferably formed of an electroconductive metallic material in the through-holes 37B, 38B, and 39B, respectively. Thereby, the transmission lines 37 to 40 are connected in series with each other via the pass-through lines.

Moreover, the widths of the transmission lines 37 to 40 preferably have substantially the same value, and also, the thicknesses of the magnetic sheets 32b to 32i preferably have substantially the same value. Thereby, the characteristic impedances of the transmission lines 37 to 40 are substantially constant over the whole length thereof.

The ground conductors 41 are disposed between the magnetic sheets 32a to 32j so as to sandwich the first transmission lines 33 to 36 and the second transmission lines 37 to 40, respectively, for each layer of the laminate. The ground conductors 41 are arranged as the uppermost and lowermost layers of the magnetic sheets 32b to 32i. The first transmission lines 33 to 36 and the second transmission lines 37 to 40 are alternately overlaid.

Moreover, the ground conductors 41 are preferably formed of an electroconductive metallic material in a substantially quadrangular flat sheet, respectively, and cover substantially the entire surfaces of the magnetic sheets 32b to 32i. Moreover, the ground conductors 41 are provided with electrode portions 41A protruding toward the both end-sides in the width direction, respectively, similarly to the ground conductors 4 according to the first preferred embodiment. The electrode portions 41A are connected to the ground electrodes 44 which will be described below.

First signal electrodes 42 are disposed on both the end-sides in the longitudinal direction of the laminate 32 (the magnetic sheets 32a to 32j), respectively. The signal electrodes 42 are preferably formed of an electroconductive metallic material, and are connected to a wiring for a signal. One of the signal electrodes 42 is connected to the electrode portion 33A of the transmission line 33, and the other signal electrode 42 is connected to the electrode portion 36B of the transmission line 36.

The second signal electrodes 43 are arranged on both the end-sides in the longitudinal direction of the laminate 32 (the magnetic sheets 32a to 32j), respectively. The signal electrodes 43 are preferably formed of an electroconductive metallic material, are positioned so as to be shifted from the first signal electrodes 42 in the width direction of the laminate 32, and are insulated from the first signal electrodes 42. One of the signal electrodes 43 is connected to the electrode portion 37A of the transmission line 37, and the other signal electrode 43 is connected to the electrode portion 40B of the transmission line 40.

For example, the signal electrodes 42 and 43 function as signal-input electrodes, and other signal electrodes 42 and 43 function as signal output electrodes. However, the signal electrodes 42 and 43 may be used for signal-outputting, and the other signal electrodes 42 and 43 may be used for signal-inputting.

The ground electrodes 44 are disposed on both the end-sides in the width direction of the laminate 32. The ground electrodes 44 are preferably formed of an electroconductive metallic material and connected to the electrode portions 41A of the ground conductors 41, respectively.

According to this preferred embodiment configured as described above, substantially the same advantages of those of the first preferred embodiment can be obtained.

However, according to this preferred embodiment, the first transmission lines 33 to 36 are connected in series with each other, and also, the second transmission lines 37 to 40 are connected in series with each other. Accordingly, the overall length of the first transmission lines 33 to 36 and that of the second transmission lines 37 to 40 can be increased, respectively. Thus, the attenuation of noise can be increased.

Moreover, the first and second transmission lines 33 to 36 and 37 to 40 are formed independently of each other. A low-pass filter including the first transmission lines 33 to 36 and a low-pass filter including the second transmission lines 37 to 40 can be provided in a single laminate 32. Therefore, regarding the noise filter 41 as a whole, a noise filter array including two low-pass filters can be formed. Accordingly, the ground conductors 41, the ground electrodes 44, and so forth can be used in common in contrast to the case in which two low pass filters are formed independently of each other. Thus, the size of the noise filter 31 can be reduced.

Figure 19:
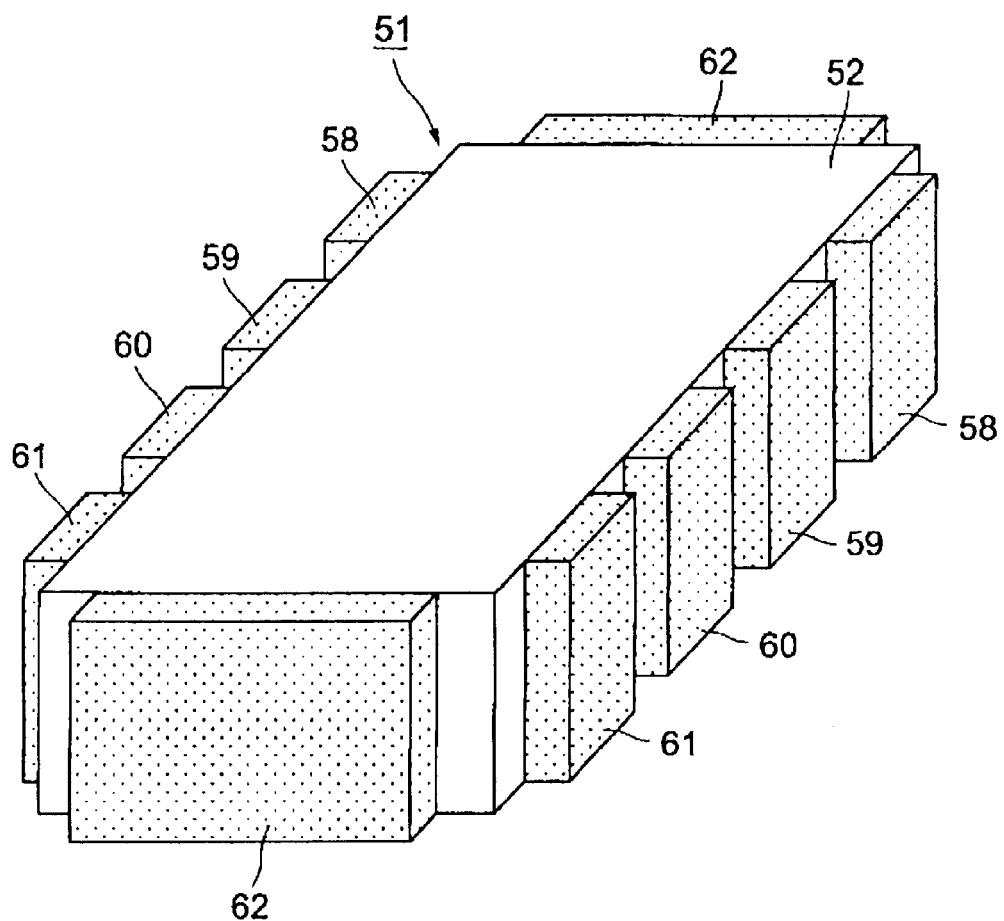
FIG. 19 is a perspective view of a noise filter according to a noise filter according to a fourth preferred embodiment of the present invention.
Figure 20:
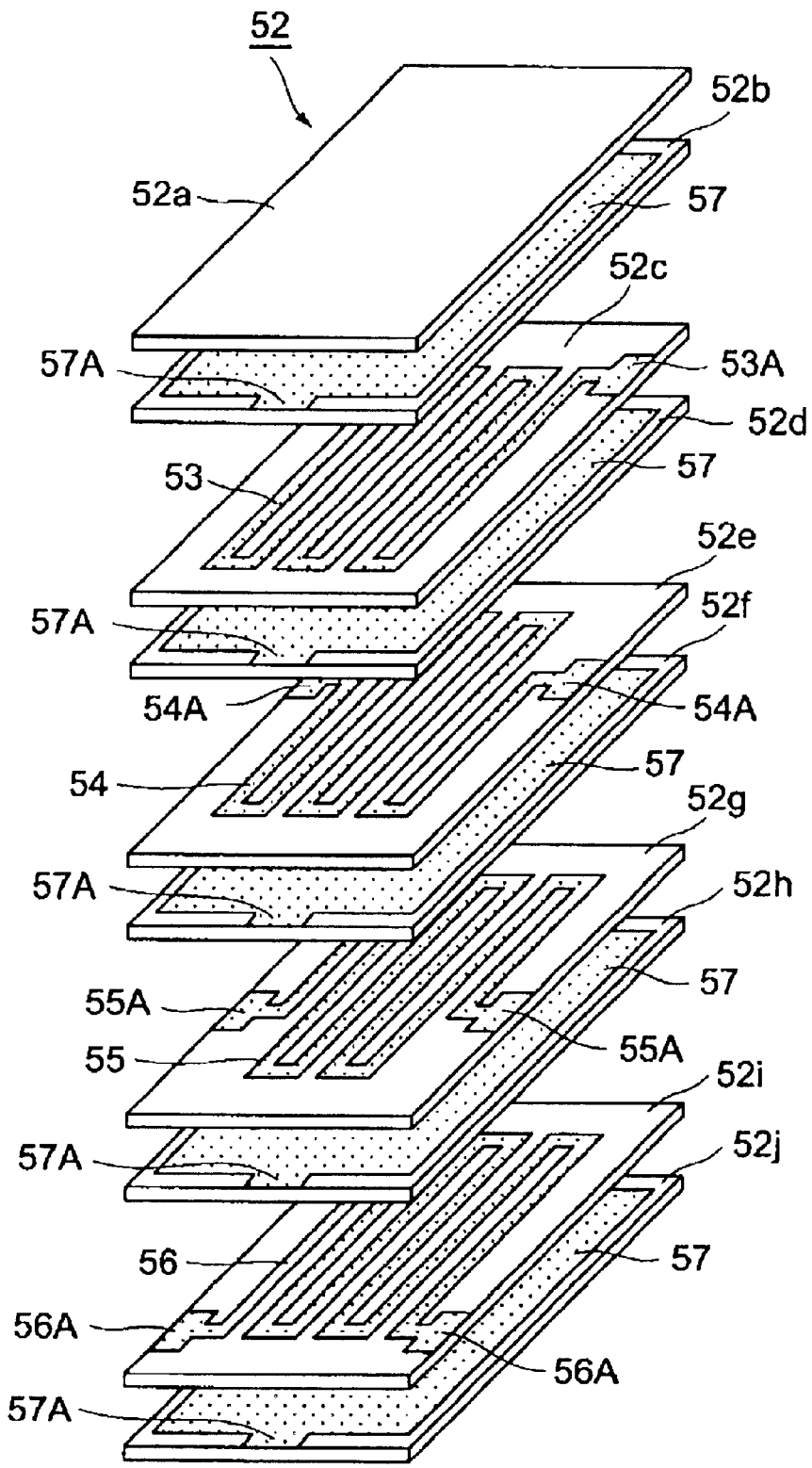
FIG. 20 is an exploded perspective view of the noise filter of the fourth preferred embodiment of the present invention.
Figure 21:
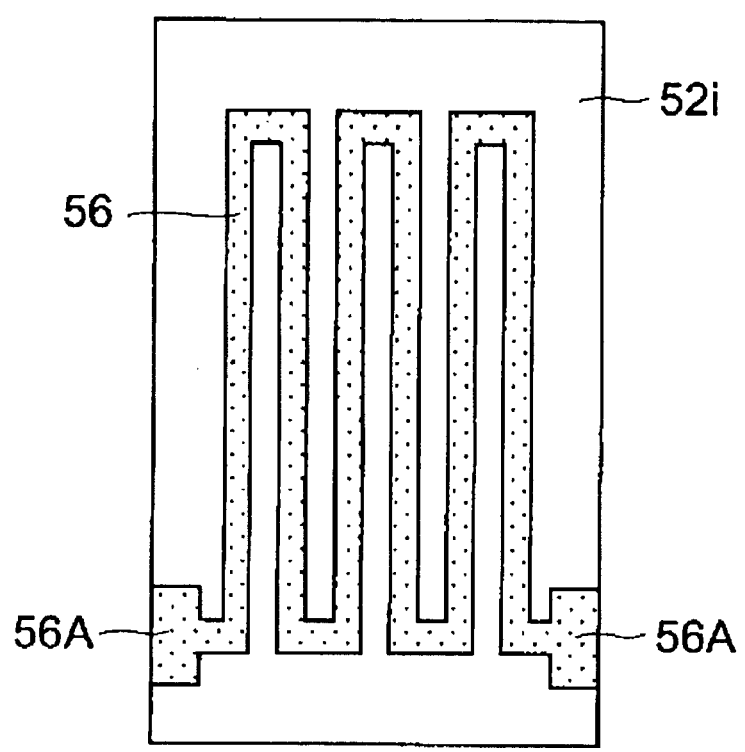
FIG. 21 is a plan view of the fourth transmission line of the transmission lines shown in FIG. 20.
Figure 22:
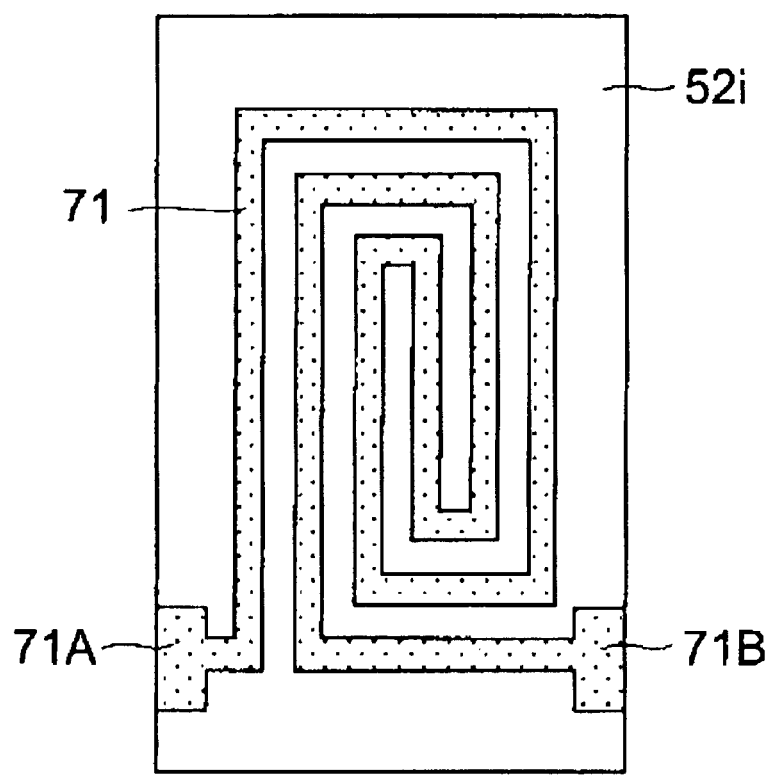
FIG. 22 is a plan view of a transmission line according to a second modification example of preferred embodiments of the present invention.

FIGS. 19 and 21 show a noise filter according to a fourth preferred embodiment of the present invention. Characteristically, in the noise filter of this preferred embodiment, transmission lines and ground conductors are alternately overlaid between magnetic sheets in such a manner that the uppermost and lowermost layers of the magnetic sheets are made of the ground conductors. One-end sides of the transmission lines each included in the plural layers are connected to signal input electrodes which are different from each other, and the other-end sides of the transmission lines each included in the plural layers are connected to signal output electrodes which are different from each other.

A noise filter 51 includes magnetic sheets 52a to 52j, first to fourth transmission lines 53 to 56, ground conductors 57, first to fourth signal electrodes 58 to 61, and ground conductors 62, which will be described below.

A laminate 52 has a substantially prism shape which constitutes the outline of the noise filter 51. The laminate 32 is formed by, e.g., laminating ten magnetic sheets 52a to 52j. The magnetic sheets 52a to 52j are formed into a sheet shape, respectively, and are preferably made of a ceramic material having a magnetic property such as ferrite or other suitable material.

A first transmission line 53 is provided between the magnetic sheets 52b and 52c. The transmission line 53 is preferably formed of an electromagnetic metallic material and so as to have a thin belt pattern, and has a zigzag pattern so as to meander turning around several times in the width direction of the laminate 52 (the front-rear surface direction in FIG. 20). On both the end sides of the transmission line 53, electrode portions 53A are arranged so as to be extended in the longitudinal direction (the left-right side of FIG. 20) of the laminate 52 toward both end-sides. These electrode portions 53A are arranged e.g., on one-end sides in the width direction of the laminate 52.

A second transmission line 54 is provided between the magnetic sheets 52d and 52e. The transmission line 54 is preferably formed of an electromagnetic metallic material in a meandering-zigzag pattern similarly to the first transmission line 53. On both the end sides of the transmission line 54, electrode portions 54A are arranged so as to be extended in the longitudinal direction toward both the end-sides of the laminate 52. These electrode portions 54A are arranged in positions different from those of the first electrode portions 53A, for example, are arranged in the centers in the width direction of the laminate 52.

A third transmission line 55 is provided between the magnetic sheets 52f and 52g. The transmission line 55 is preferably formed of an electromagnetic metallic material in a meandering-zigzag pattern similarly to the first transmission line 53. On both the end sides of the transmission line 55, electrode portions 55A are arranged so as to be extended in the longitudinal direction toward both the end-sides of the laminate 52. These electrode portions 55A are arranged in positions different from those of the first electrode portions 53A and the second electrode portions 54A, for example, are arranged in the middle positions between the second electrode portions 54A and the other-ends in the width direction of the laminate 52, respectively.

A fourth transmission line 56 is provided between the magnetic sheets 52h and 52i. The transmission line 56 is preferably formed of an electromagnetic metallic material in a meandering-zigzag pattern similarly to the first transmission line 53. On both the end sides of the transmission line 56, electrode portions 56A are arranged so as to be extended in the longitudinal direction toward both the end-sides of the laminate 52. These electrode portions 56A are arranged in positions different from those of the first to third electrode portions 53A to 55A, for example, are arranged in the other-ends in the width direction of the laminate 52, respectively.

The ground conductors 57 are disposed between the magnetic sheets 52a to 52j so as to sandwich the first to fourth transmission lines 53 to 56, respectively. The ground conductors 57 are arranged on the uppermost and lowermost layers of the magnetic sheets 52b to 52i and also are laminated alternately with the transmission lines 53 to 56 between the magnetic sheets 52b to 52i. The ground conductors 57 are preferably formed of an electroconductive metallic material into a substantially quadrangular flat sheet shape, respectively, and cover substantially the entire surfaces of the magnetic sheets 52b to 52i. Moreover, the ground conductors 57 are provided with electrode portions 57A which are protruded toward the both end-sides similarly to the ground conductors 4. The electrode portions 57A are connected to ground electrodes 62 which will be described below.

The first to fourth signal electrodes 58 to 61 are preferably formed of an electroconductive metallic material. The first to fourth signal electrodes 58 to 61 are provided on the side surfaces of the laminate 52 which are on the both the end-sides in the longitudinal direction of the laminate 52. In this case, the signal electrodes 58 to 61 are arranged so as to be paired, respectively. The first to fourth signal electrodes 58 to 61 are arranged in different positions in the width direction of the laminate 52, for example, are arranged sequentially from one-end side to the other end side in the width direction of the laminate 52, and are insulated from each other.

The first signal electrodes 58 are connected to the electrode portions 53A of the first transmission lines 53. The second signal electrodes 59 are connected to the electrode portions 54A of the second transmission lines 54. The third signal electrodes 60 are connected to the electrode portions 55A of the third transmission lines 55. The fourth signal electrodes 61 are connected to the electrode portions 56A of the fourth transmission lines 56.

Of the first to fourth signal electrodes 58 to 61 arranged so as to be paired, respectively, the signal electrodes 58 to 61 positioned on one side constitute signal input electrodes, and the signal electrodes 58 to 61 positioned on the other side constitute signal output electrodes.

The ground electrodes 62 are provided on both the end-sides in the width direction of the laminate 52. The ground electrodes 62 are preferably formed of an electroconductive metallic material and connected to the electrode portions 57A of the ground conductors 57.

Therefore, according to this preferred embodiment configured as described above, substantially the same advantages as those of the first preferred embodiment can be obtained. On the other hand, in this preferred embodiment, the transmission lines 53 to 56 contained in the plural layers are connected to the signal electrodes 58 to 61 which are different from each other, so that the transmission lines 53 to 56 contained in the plural layers can be operated as low pass filters, individually. Thus, as a whole, a noise filter array can be formed.

In the case where the plural transmission lines 33 to 36 and 37 to 40 are provided in the same layers, respectively, and the plural layer transmission lines 33 to 36 and 37 to 40 are connected as in the third preferred embodiment, the area of the magnetic sheets 32a to 32j is required to be increased with the number of low-pass filters. Therefore, if a lot of low-pass filters are provided in the noise filter 31, the noise filter 31 tends to have a large size.

On the other hand, according to this preferred embodiment, the plural layer transmission lines 53 to 56 define the low-pass filters which are independent from each other for the respective layers. Accordingly, if the number of the low-pass filters is increased, it is sufficient to increase the number of the magnetic sheets 52a to 52j. Therefore, even in the case where a lot of low-pass filters are provided in the noise filter 51, the noise filter can be reduced in size.

Moreover, in the case in which the plural layer transmission lines 33 to 36 and 37 to 40 are connected through the through-holes 33B to 35B and 37B to 39B (pass-through lines) as in the third preferred embodiment, mismatching tends to occur in the vicinities of the through-holes 33B to 35B and 37B to 39B which have discontinuous points. Moreover, it is required to drill the through-holes 33B to 35B and 37B to 39B and fill an electroconductive paste for the pass-through lines, and so forth. Thus, the number of production processes is increased, and the manufacturing cost tends to increase.

On the other hand, according to this preferred embodiment, the plural layer transmission lines 53 to 56 are preferably operated as low-pass filters independent from each other for the respective layers. Thus, no impedance mismatching occurs along the transmission lines 53 to 56. Therefore, no reflection of noise occurs along the transmission lines 53 to 56, resonance of noise can be prevented, and the impedance matching to an external circuit can be easily achieved. Moreover, according to this preferred embodiment, drilling for the through-holes and so forth is not required. Thus, the production process can be simplified, and the manufacturing cost can be reduced.

Moreover, in the case in which the plural transmission lines 33 to 36 and 37 to 40 are provided in the same layers, respectively, as in the third preferred embodiment, crosstalk tends to occur between the adjacent transmission lines 33 to 36 and 37 to 40. Thus, a signal tends to be easily deteriorated.

On the other hand, according to this preferred embodiment, the ground conductors 57 are preferably provided between the transmission lines 53 to 56. Thus, crosstalk can be prevented between the adjacent transmission lines 53 to 56, due to the ground conductors 57, and a signal can be securely propagated.

Moreover, in the case in which the plural layer transmission lines 33 to 36 and 37 to 40 are connected through the through-holes 33B to 35B and 37B to 39B (pass-through lines) as in the third preferred embodiment, the ground conductors 41 are also required to be provided with holes each having a diameter of about 100 $\mu$m as the through-holes 33B to 35B and 37B to 39B in order to avoid contacting the pass-through lines. In this case, the transmission lines can not be arranged in the peripheries of the holes. Thus, the area of one magnetic sheet where the transmission lines can be formed is decreased, the transmission lines are reduced, and the noise attenuation is reduced.

On the other hand, according to this preferred embodiment, no through-holes are provided for the magnetic sheets 52a to 52j. Accordingly, the transmission lines 53 to 56 can be arranged on the entire areas of the magnetic sheets 52a to 52j. Therefore, the lengths of the transmission lines can be increased, and the noise attenuation can be significantly improved.

Moreover, in the case where the plural layer transmission lines 33 to 36 and 37 to 40 are connected in the thickness direction of the laminate 32 as in the third preferred embodiment, to avoid contact of transmission lines 33 to 36 and 37 to 40, for example, the input signal electrode 42 and the output signal electrode 42 are required to be opposed to each other, and also, the input signal electrode 43 and the output signal electrode 43 are required to be opposed to each other.

On the other hand, according to this preferred embodiment, the plural layer transmission lines 53 to 56 are independent of each other for the respective layers. Thus, the input signal electrodes 58 to 61 and the output signal electrodes 58 to 61 are not required to be opposed to each other, respectively. For this reason, e.g., the input signal electrodes 58 to 61 are arranged sequentially from one side to the other side in the width direction of the laminate 52. However, the input signal electrodes 58 to 61 may be also arranged sequentially from the other side to the one side in the width direction of the laminate 52. Thereby, the input signal electrodes 58 to 61 and the output signal electrodes 58 to 61 can be arranged independently of each other, and thus, the design flexibility can be greatly improved.

Moreover, according to this preferred embodiment, the plural layer transmission lines 53 to 56 define low-pass filters which are independent of each other for the respective layers. Therefore, the characteristic impedances of the respective low-pass filters can be made different from each other by setting the thicknesses of the magnetic sheets 52b to 52i at different values. Accordingly, the noise filter 51 of this preferred embodiment can be easily applied to wirings having plural different impedances.

According to the fourth preferred embodiment, the transmission lines 53 to 56 are preferably arranged in a zigzag pattern, respectively. The present invention is not restricted to this pattern. For example, a transmission line 71 having a spiral pattern of which both end-sides constitute electrode portions 71 A may be formed as shown in a second modification example of FIG. 22.

Figure 23:
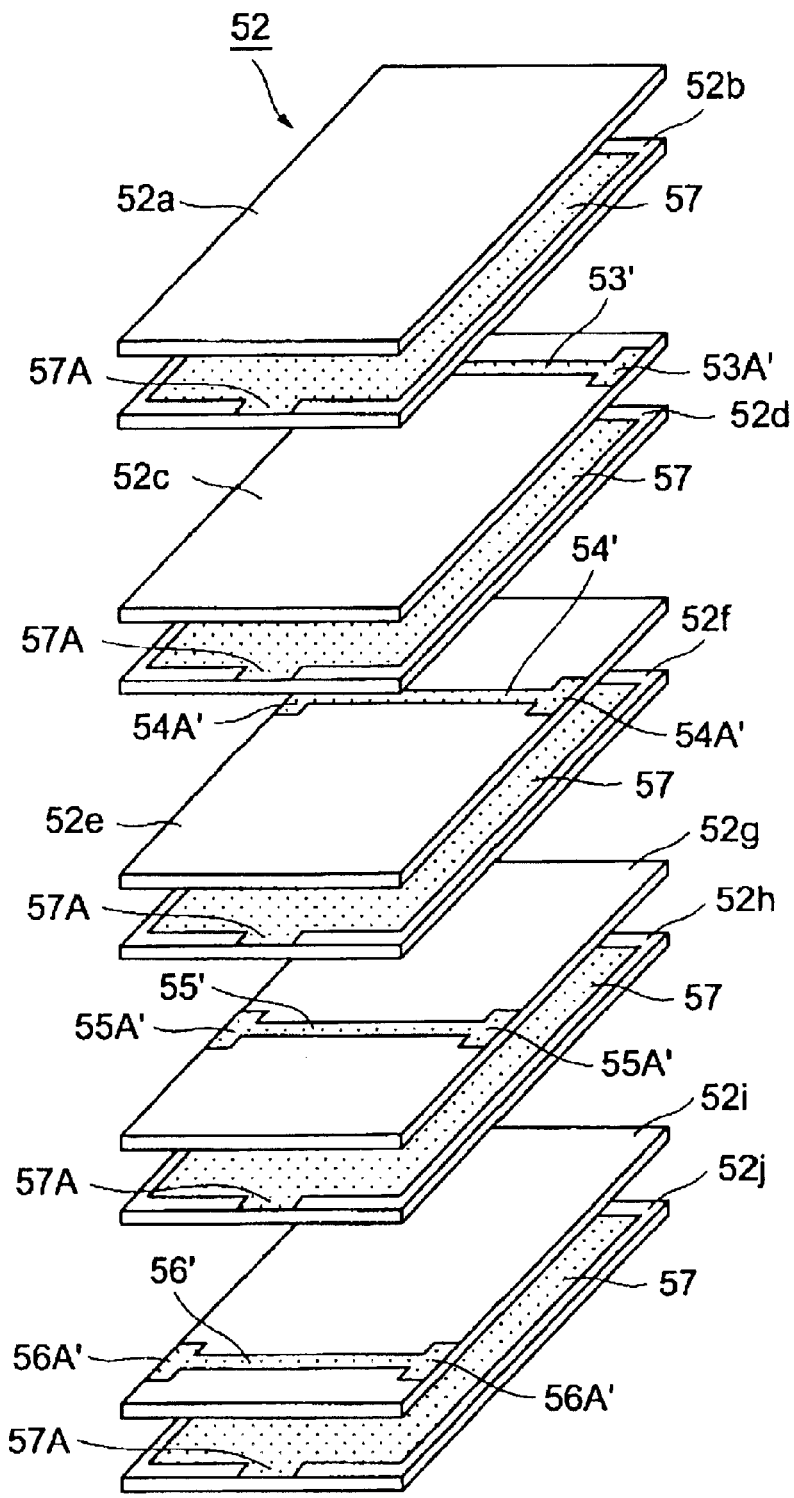
FIG. 23 is an exploded perspective view of a noise filter according to a third modification example of preferred embodiments of the present invention.
Figure 24:
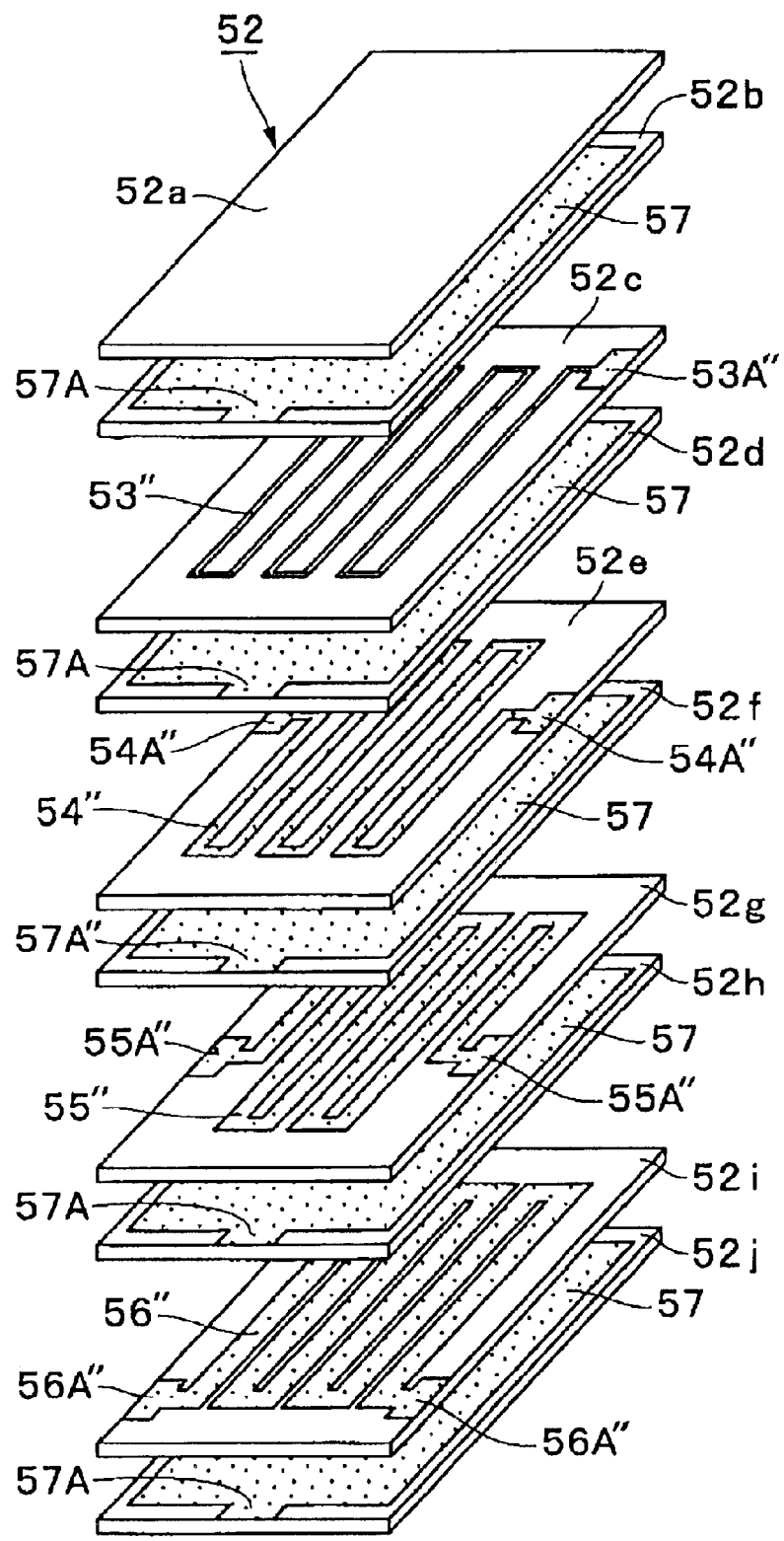
FIG. 24 is an exploded perspective view of a noise filter according to a fourth modification example of preferred embodiments of the present invention.

Moreover, when the lengths of the transmission lines are small as in the case where the cut-off frequency is high, straight-line shaped transmission lines 53' to 56' may be provided as in the third modification example of FIG. 23.

Although the transmission lines 53 to 56 preferably have the same width dimensions according to the fourth preferred embodiment, the present invention is not limited to the fourth preferred embodiment. As shown in a fourth modification illustrated in FIG. 24, transmission lines 53" to 56" may have different width dimensions.

Accordingly, the transmission lines 53" to 56" of multiple layers have different characteristic impedances. Thus, the transmission lines 53" to 56" of the multiple layers are connected to wiring having a plurality of types of characteristic impedances while impedances of the transmission lines 53" to 56" are matched with those of the wring. Since the transmission lines 53" to 56" have different characteristic impedances, independent use of the individual transmission lines 53" to 56" realizes low-pass filters having four types of characteristic impedances, depending on the number of layers of the transmission lines 53" to 56".

When the transmission lines constituting two or three layers or all layers (four layers) of the multiple layers of the transmission lines 53" to 56" are connected in parallel to one another, the number of types of characteristic impedances is increased by, for example, ten. Compared with a case in which the characteristic impedances of the transmission lines 53" to 56" are set to the equal values, the types of characteristic impedances are increased. Therefore, the number of types of applicable wiring is increased.

Although the transmission lines 53" to 56" are made different by setting the width dimensions of the transmission lines 53" to 56" to different values according to the fourth modification of preferred embodiments of the present invention, the present invention is not limited to the fourth modification. For example, the thickness dimensions of the magnetic sheets 52b to 52i may be set to different values. Alternatively, both the width dimensions of the transmission lines 53" to 56" and the thickness dimensions of the magnetic sheets 52b to 52i may be set to different values.

Figure 25:
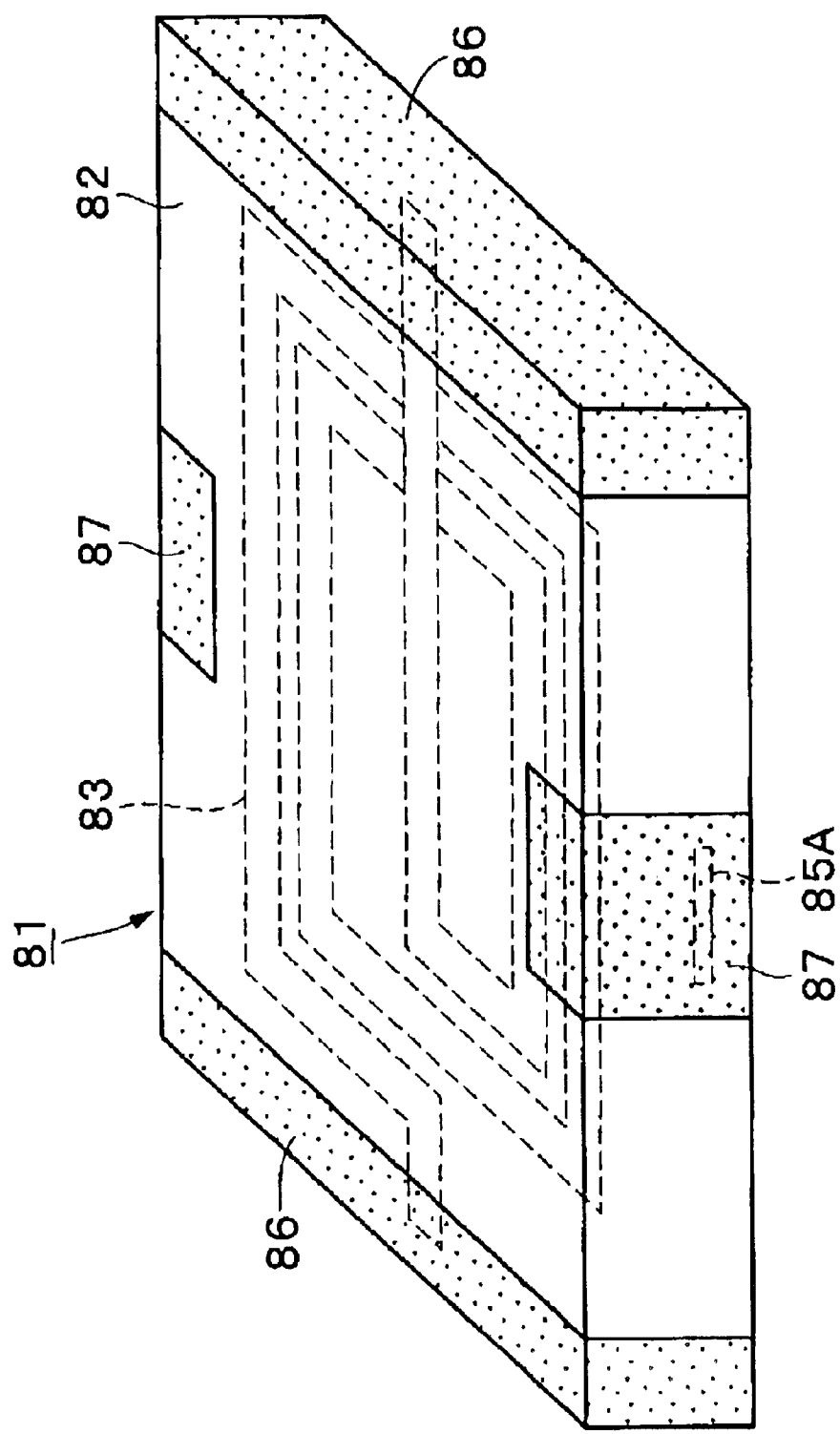
FIG. 25 is a perspective view of a noise filter according to a fifth preferred embodiment of the present invention.
Figure 26:
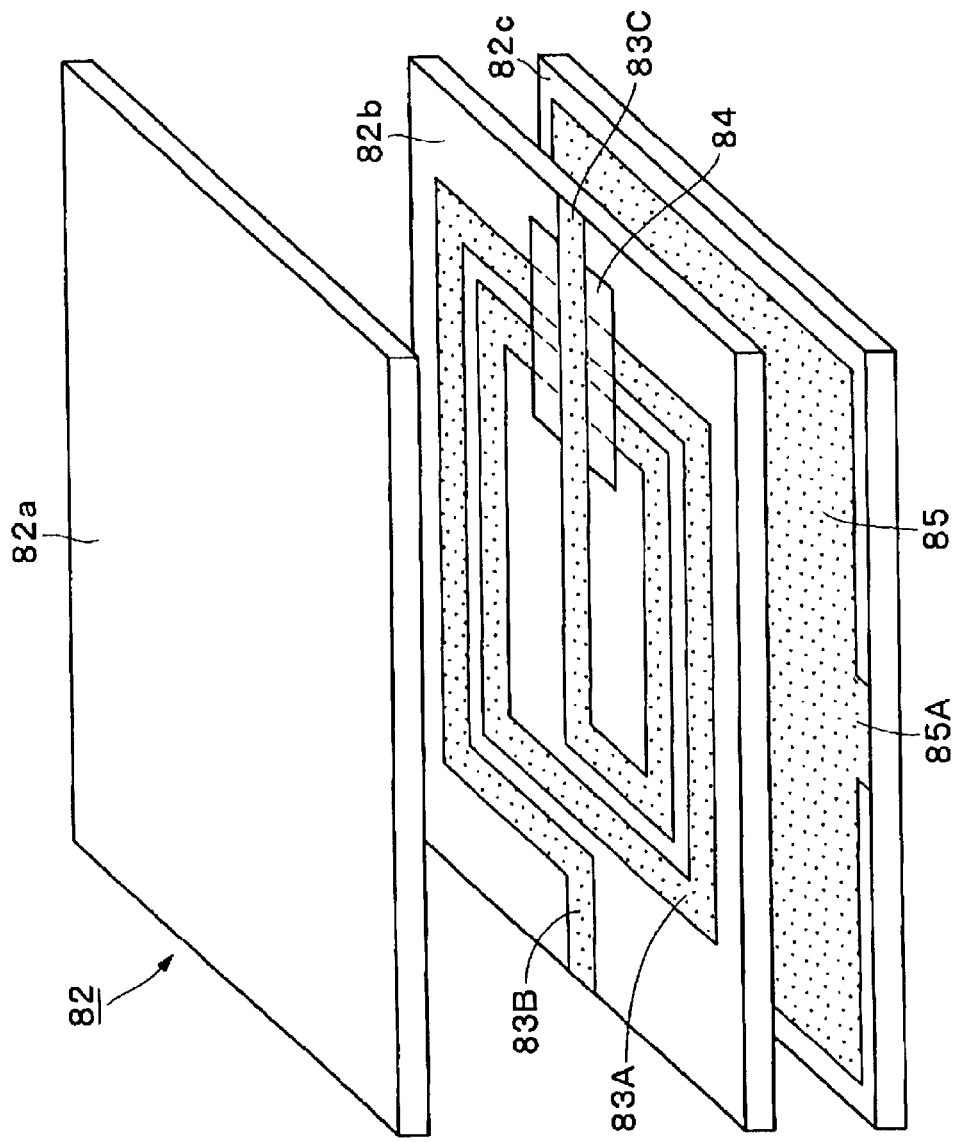
FIG. 26 is an exploded perspective view of the noise filter according to the fifth preferred embodiment of the present invention.
Figure 27:
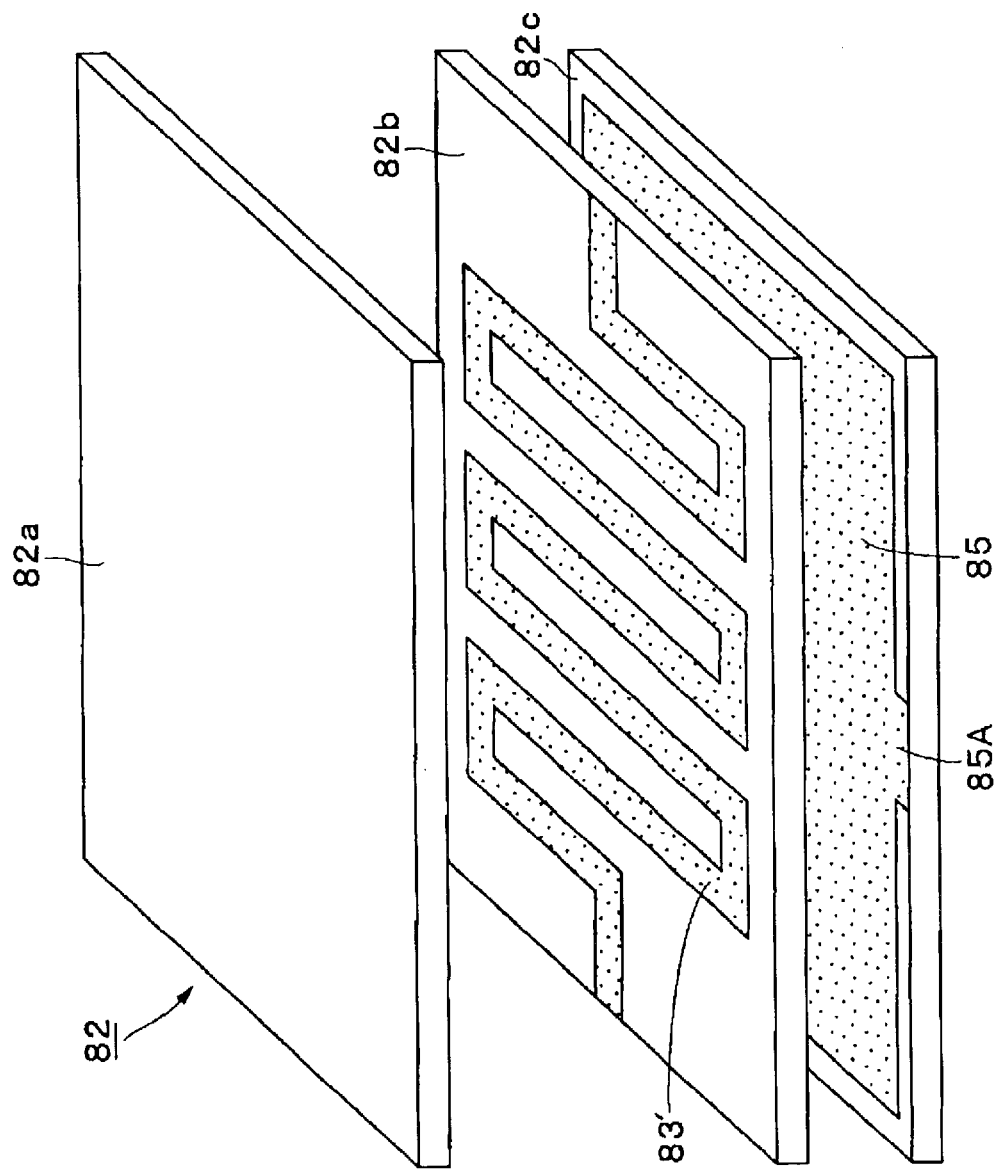
FIG. 27 is an exploded perspective view of a noise filter according to a fifth modification example of preferred embodiments of the present invention, which is similar to FIG. 26.

FIGS. 25 and 26 show a noise filter according to a fifth preferred embodiment of the present invention. The noise filter of the fifth preferred embodiment is characterized by including magnetic sheets, a transmission line arranged on the front surface of one of the magnetic sheets, and a ground conductor arranged on the bottom surface of the one magnetic sheet and covering, from the back, the entirety of the transmission line.

A noise filter 81 of the fifth preferred embodiment includes magnetic sheets 82a to 82c, a transmission line 83, a ground conductor 85, signal electrodes 86, and grounding electrodes 87, which will be described later.

A substantially prismatic layered product 82 defining the outer shape of the noise filter 81 is formed by baking, for example, the three magnetic sheets 82a to 82c. As in the first preferred embodiment, the magnetic sheets 82a to 82c are preferably substantially rectangular sheets and made of a ceramic material, such as ferrite.

The first transmission line 83 arranged on the front surface of the magnetic sheet 82b includes a spiral coil portion 83A and electrode portions 83B and 83C. The electrode portion 83B is connected to the outer boundary of the coil portion 83A, and the electrode portion 83C is connected to the center of the coil portion 83A. The electrode portions 83B and 83C extend toward both end surfaces, in the longitudinal direction, of the layered product 82. An insulating layer 84 made of ferrite or other suitable material, as in the magnetic sheet 82b, is arranged between the coil portion 83A and the electrode portion 83C. The coil portion 83A and the electrode portion 83C are superposed on each other, with the insulating layer 84 provided therebetween.

As in the first preferred embodiment, the transmission line 83 is preferably made of a conductive metal material. Substantially the entire transmission line 83 is covered, from the back, by the ground conductor 85, which will be described later. The electrode portions 83B and 83C are connected to the signal electrodes 86, which will be described later.

The ground conductor 85 is arranged on the back surface of the magnetic sheet 82b (between the magnetic sheets 82b and 82c). The ground conductor 85 is a substantially rectangular sheet made of a conductive metal material and substantially covers the entire back surface of the magnetic sheet 82b. The ground conductor 85 includes tongue-shaped electrode portions 85A protruding toward both ends in the width direction of the magnetic sheet 82b. The electrode portions 85A are located in the middle positions, in the longitudinal direction, of the magnetic sheet 82b having a substantially rectangular shape. The electrode portions 85A are connected to the grounding electrodes 87, which will be described later.

The signal electrodes 86 are arranged adjacent to both ends, in the longitudinal direction, of the layered product 82 (magnetic sheets 82a to 82c). The signal electrodes 86 cover end surfaces, in the longitudinal direction, of the layered product 82 and the periphery of the end surfaces. The signal electrodes 86 are connected to the electrode portions 83B and 83C of the transmission line 83.

The grounding electrodes 87 are arranged in the middle positions, in the longitudinal direction, of the layered product 82 and are adjacent to both ends, in the width direction, of the layered product 82. The grounding electrodes 87 are provided on end surfaces (end surfaces in the width direction) of the layered product 82 and are connected to the electrode portions 85A of the ground conductor 85.

According to the fifth preferred embodiment, the transmission line 83 is provided on the front surface of the magnetic sheet 82b, and the entire back surface of the transmission line 83 is covered by the ground conductor 85 provided on the back surface of the magnetic sheet 82b. As in the first preferred embodiment, noise is suppressed by utilizing heat dissipation by the magnetic sheet 82b or the like.

The characteristic impedance of the noise filter 81 is set by setting the width dimension of the transmission line 83 and the thickness dimension of the magnetic sheet 82b to appropriate values. At the same time, the characteristic impedance is substantially maintained at a constant value irrespective of the signal frequency. The impedance is matched in substantially the entire frequency domain with a circuit connected to the noise filter 81. Accordingly, return loss of the noise filter 81 is reduced.

Since the transmission line 83 is covered from the back by the ground conductor 85, the characteristic impedance of the entire transmission line 83 is set to a constant value. Noise reflection in the transmission line 83 is prevented from occurring, and noise resonance is suppressed.

Since the transmission line 83 is spiral, magnetic fluxes generated by the transmission line 83 are added together. Compared with a case in which the transmission line 83 is linear or zigzag, the inductance and the characteristic impedance of the transmission line 83 are increased. As in wiring for use in a digital circuit, when the characteristic impedance is relatively large (about 100 Ω to about 150 Ω), the noise filter 81 for matching the impedance with such wiring is implemented.

The signal electrodes 86, which are connected to both ends of the transmission line 83, are arranged adjacent to both ends, in the longitudinal direction, of the magnetic sheet 82b (layered product 82). The grounding electrodes 87, which are connected to the ground conductor 85, are arranged in the middle positions, in the longitudinal direction, of the magnetic sheet 82b and are adjacent to both end surfaces, in the width direction, of the magnetic sheet 82b. Therefore, the signal electrodes 86 and the grounding electrodes 87 are easily connected to wiring and ground terminals, and it becomes easier to assemble the noise filter 81.

The signal electrodes 86 and the grounding electrodes 87 are provided on different end surfaces of the substantially rectangular magnetic sheet 82b. Compared with a case in which signal electrodes and grounding electrodes are arranged on the same end surfaces, such as that shown in Japanese Unexamined Utility Model Registration Application Publication No. 6-44228, the outer shape of the noise filter 81 is made narrower. Even when numerous wires are arranged in parallel to one another at small intervals, such as in the case of a bus line or the like, the noise filter 81 is easily applicable to each of the wires.

According to the fifth preferred embodiment, the transmission line 83 is preferably spiral. Alternatively, as shown in a fifth modification illustrated in FIG. 27, a transmission line 83' is meandering and zigzag.

In this case, compared with a case in which the transmission line 83' is linear, the length dimension of the transmission line 83' is increased, and noise attenuation is increased. Compared with a case, as in the fifth preferred embodiment, in which the transmission line 83 is spiral, the width dimension of a noise filter 81' is reduced. The noise filter 81' is thus easily applicable to a bus line or the like in which numerous wires are arranged in parallel to one another.

Figure 28:
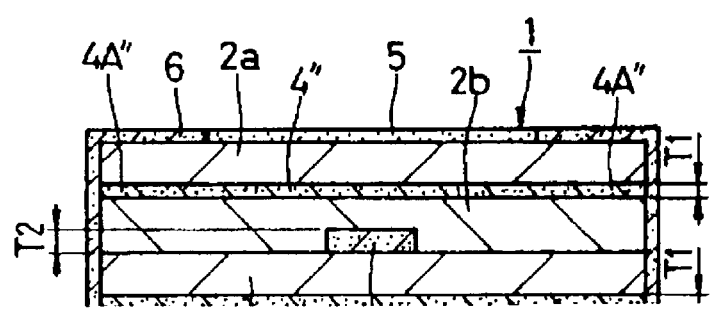
FIG. 28 is a sectional view of a noise filter according to a sixth modification example of preferred embodiments of the present invention, taken from a position similar to that of FIG. 3.

As shown in a sixth modification illustrated in FIG. 28, the thickness dimension T1 of each of the ground conductors 4" may be thinner than the thickness dimension T2 of a transmission line 3". Accordingly, the thickness dimension of the overall noise filter 1 is reduced, and the noise filter 1 is miniaturized. Since the thickness dimension T2 of the transmission line 3" is greater than the thickness dimension T1 of each of the ground conductors 4", the DC resistance of the transmission line 3" is reduced, allowing a larger current to flow through the transmission line 3".

Furthermore, according to the above-described respective preferred embodiments, the magnetic sheets 2a to 2d, 12a to 12n, 32a to 32j, 52a to 52j, and 82a to 82c are preferably made of a ceramic material such as ferrite or other suitable material, and fired. However, the present invention is not restricted to this. The magnetic sheets may be formed by mixing magnetic powder such as carbonyl iron or other suitable material with a resin material and forming it. Thereby, the magnetic sheets can be bonded with an adhesive to form a noise filter. Thus, production process such as firing or the like can be omitted. The production efficiency can be enhanced. In this case, the cut-off frequency of the noise filter can be set by use of the composition of magnetic powder contained therein, the ratio of a resin material to the magnetic powder, and the length of a transmission line.

As described above, according to the noise filter of various preferred embodiments of the present invention, the resonance of noise can be prevented. The filter has a small size and is inexpensive, and is useful especially in an electronic device having a signal frequency of higher than about 100 MHz.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A noise filter comprising:
   a plurality of magnetic sheets superposed on one another;
   a plurality of transmission lines; and
   a plurality of ground conductors; wherein
   the plurality of ground conductors are arranged on the top and bottom layers of the magnetic sheets;
   the transmission lines and the ground conductors are alternately stacked between the magnetic sheets;
   one end of each of the transmission lines is connected to a different corresponding signal input electrode, and the other end of each of the transmission lines is connected to a different corresponding signal output electrode, and the transmission lines of the multiple layers have different characteristic impedances.

2. A noise filter according to claim 1, wherein the transmission lines have a meandering and zigzag configuration.

3. A noise filter according to claim 1, wherein the transmission lines have a spiral configuration.

4. A noise filter according to claim 1, wherein the magnetic sheets are made of sintered ferrite.

5. A noise filter comprising:

a plurality of magnetic sheets;

a transmission line arranged on a front surface of one of the magnetic sheets; and a ground conductor arranged on a back surface of said one of the magnetic sheets, the ground conductor covering, from the back, the entirety of the transmission line.

6. A noise filter according to claim 5, wherein the transmission line has a meandering and zigzag configuration.

7. A noise filter according to claim 5, wherein the magnetic sheets are substantially rectangular, signal electrodes connected to both ends of the transmission line are arranged adjacent to both ends, in the longitudinal direction, of said one of the magnetic sheets, and grounding electrodes connected to the ground conductor are arranged in the middle positions, in the longitudinal direction, of said one of the magnetic sheets.

8. A noise filter according to claim 5, wherein the transmission line has a spiral configuration.

9. A noise filter according to claim 5, wherein the magnetic sheets are made of sintered ferrite.

* * * * *